(12) United States Patent
Burke

(10) Patent No.: US 11,898,375 B2
(45) Date of Patent: Feb. 13, 2024

(54) SHIELDED SELF-LATCHING LOCKING ASSEMBLY FOR A UTILITY VAULT

(71) Applicant: CHANNELL COMMERCIAL CORPORATION, Temecula, CA (US)

(72) Inventor: Edward J. Burke, Temecula, CA (US)

(73) Assignee: Channell Commercial Corporation, Temecula, CA (US)

( * ) Notice: Subject to any disclaimer, the term of this patent is extended or adjusted under 35 U.S.C. 154(b) by 83 days.

(21) Appl. No.: 17/179,175

(22) Filed: Feb. 18, 2021

(65) Prior Publication Data

US 2021/0332617 A1 Oct. 28, 2021

Related U.S. Application Data

(63) Continuation-in-part of application No. 16/855,820, filed on Apr. 22, 2020.

(51) Int. Cl.
  *E05B 65/00* (2006.01)
  *E05B 35/00* (2006.01)
  (Continued)

(52) U.S. Cl.
  CPC ........ *E05B 65/0089* (2013.01); *E05B 35/008* (2013.01); *E05B 65/006* (2013.01);
  (Continued)

(58) Field of Classification Search
  CPC .... Y10S 292/53; Y10S 292/54; Y10S 292/11; Y10S 292/38; Y10S 292/64;
  (Continued)

(56) References Cited

U.S. PATENT DOCUMENTS 1,054,782 A 3/1913 Matthews
2,268,743 A 1/1942 Falk
(Continued)

FOREIGN PATENT DOCUMENTS

CN 1641171 A 7/2005
CN 109154167 A 1/2019
(Continued)

OTHER PUBLICATIONS

Chilean Office action for Application No. 202100996, dated Mar. 14, 2022, 21 pages.
(Continued)

*Primary Examiner* — Kristina R Fulton
*Assistant Examiner* — James Edward Ignaczewski
(74) *Attorney, Agent, or Firm* — Lewis Roca Rothgerber Christie LLP

(57) ABSTRACT

A shielded locking system for securely closing a lid on an enclosure, such as a grade level utility vault, including an L-bolt connected to a spring-biased slide member positioned on the underside of the lid that rotates in a slotted housing that securely retains the L-bolt under the lid, the slide member engaging an abutment on the inside of the enclosure when the lid is forced down over an opening in the enclosure by downward force on the lid which progressively causes the latch to retract against the spring-bias from contact with the abutment and then snaps the latch into a spring-biased locking position under the abutment, and a non-conductive cover positioned over and connected to the locking system to shield the L-bolt from electrical conductivity from within the enclosure.

16 Claims, 20 Drawing Sheets

(51) Int. Cl.
  *E05C 1/12* (2006.01)
  *H05K 5/02* (2006.01)
  *H05K 7/18* (2006.01)

(52) U.S. Cl.
  CPC .............. *E05C 1/12* (2013.01); *H05K 5/0221* (2013.01); *H05K 7/186* (2013.01); *E05Y 2900/612* (2013.01)

(58) Field of Classification Search
  CPC ............... F16B 5/0036; F16B 2200/20; Y10T 403/7007; Y10T 403/7015; Y10T 403/61; Y10T 403/5773; Y10T 403/69; Y10T 292/432; E02D 29/1427; E05B 9/00; E05B 9/02; E05B 85/02; E05B 65/006; E05B 65/0089; E05B 35/008; B65D 45/22; B65D 45/16; B65D 43/22; E05C 1/12; H05K 5/0221; H05K 7/186; E05Y 2900/612
  USPC .... 292/137, 163, 164, 1, 10, 17, 60, 62, 81, 292/80; 220/345.4, 326, 324, 315; 70/163
  See application file for complete search history.

(56) References Cited

U.S. PATENT DOCUMENTS

| | | | |
|---|---|---|---|
| 2,642,300 A * | 6/1953 | Pelcin .................... | E05C 1/145 |
| | | | 292/DIG. 31 |
| 3,751,949 A | 8/1973 | Castle | |
| 4,126,224 A | 11/1978 | Laauwe et al. | |
| 4,966,422 A * | 10/1990 | Albright ............... | E05B 65/462 |
| | | | 292/159 |
| 5,433,588 A * | 7/1995 | Monk ................. | F04B 43/1253 |
| | | | 417/477.2 |
| 7,146,831 B2 * | 12/2006 | Antonucci .............. | E05B 13/10 |
| | | | 292/DIG. 31 |
| 7,216,459 B1 | 5/2007 | Akkala et al. | |
| 7,547,051 B2 | 6/2009 | Burke et al. | |
| 8,052,399 B2 | 11/2011 | Stemple et al. | |
| 8,220,298 B2 * | 7/2012 | Burke ................... | E05B 65/006 |
| | | | 292/202 |
| 2005/0144993 A1 | 7/2005 | Antonucci et al. | |
| 2008/0016780 A1 | 1/2008 | McDougle et al. | |
| 2008/0213043 A1* | 9/2008 | Thompson .......... | E02D 29/1481 |
| | | | 404/25 |
| 2009/0183658 A1 | 7/2009 | McDougle et al. | |
| 2010/0206019 A1 | 8/2010 | Burke et al. | |
| 2018/0305092 A1 | 10/2018 | Lucas | |

FOREIGN PATENT DOCUMENTS

| | | | | |
|---|---|---|---|---|
| EP | 2543800 A1 * | 1/2013 | ......... | E02D 29/1445 |
| GB | 2275729 A | 9/1994 | | |
| JP | 2011009512 A | 1/2011 | | |
| KR | 20110120954 A | 11/2011 | | |
| WO | 2010096251 A1 | 8/2010 | | |
| WO | 2017203148 A1 | 11/2017 | | |
| WO | WO-2017203148 A1 * | 11/2017 | ......... | E02D 29/1427 |

OTHER PUBLICATIONS

Korean Office action for Application No. 10-2021-0051902, dated Sep. 24, 2022, 23 pages.
Extended European Search Report for Application No. 21169457.5, dated Sep. 30, 2021.
Australian Examination Report for Application No. 2021202292, dated Jun. 23, 2022, 4 pages.
Iranian Office action for Application No. 140050140003000730, dated May 30, 2022, 16 pages.
Chinese Office action for Application No. 202110430679.8 dated May 25, 2022, 25 pages.
Japanese Office action for Application No. 2021-071223, dated Sep. 27, 2022, 3 pages.
Philippine Office action for Application No. 1/2021/050165, dated Sep. 20, 2023, 5 pages.

* cited by examiner

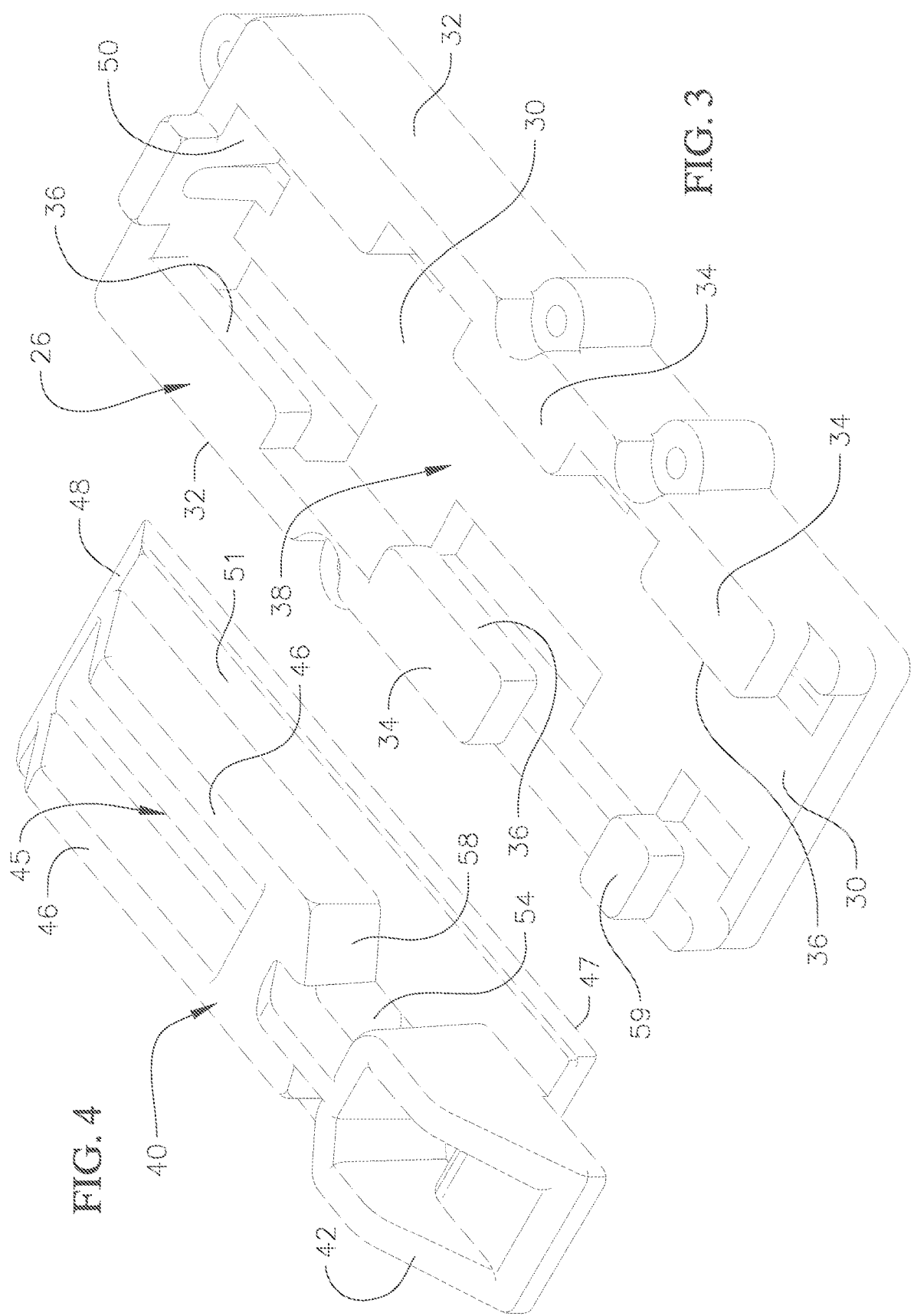

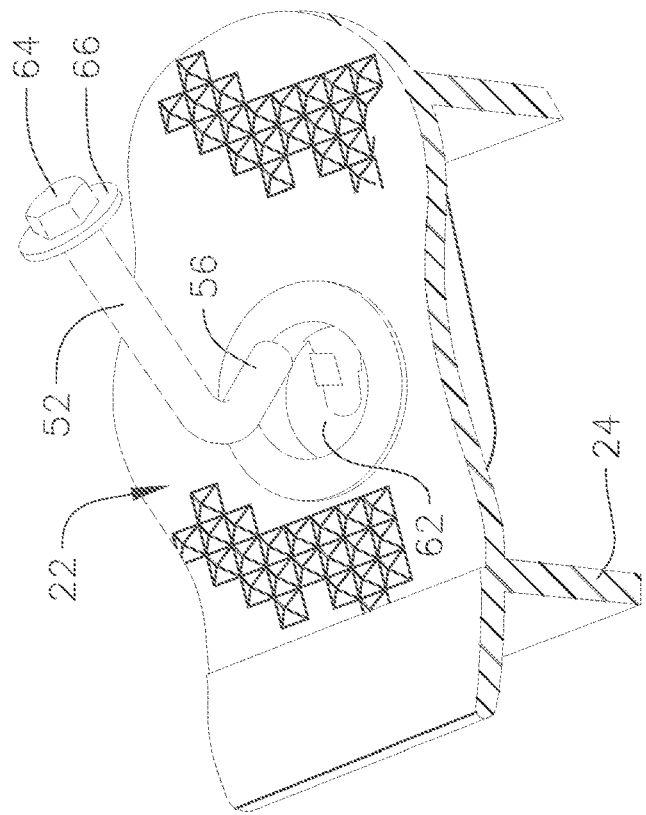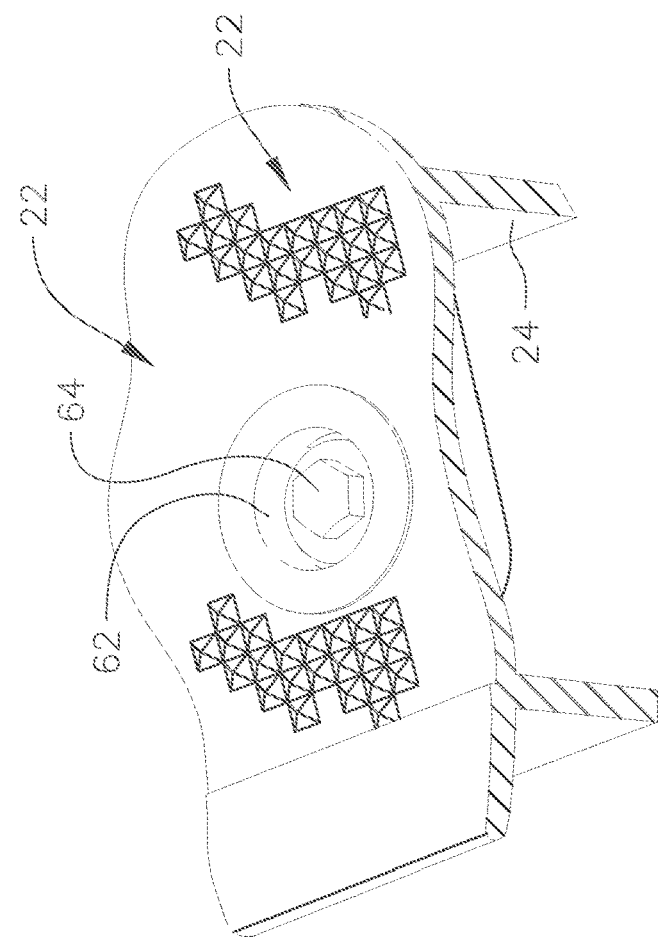

SHIELDED SELF-LATCHING LOCKING ASSEMBLY FOR A UTILITY VAULT

CROSS-REFERENCE TO RELATED APPLICATION(S)

This application is a continuation-in part of U.S. application Ser. No. 16/855,820, filed Apr. 22, 2020, the disclosure of which is hereby incorporated herein by reference in its entirety.

FIELD OF THE INVENTION

This invention relates to a shielded locking system useful in closing and securely locking a lid on enclosures such as grade level boxes or utility vaults.

BACKGROUND OF THE INVENTION

The present shielded locking assembly provides security for enclosures such as grade level utility vaults used to contain cable TV equipment, data transmission lines, telephone switching equipment, service lines, power transmission devices, and water meters, for example. The invention also has application to other types of ground level enclosures and similar enclosures generally. An aspect of the invention is to prevent conductive contact between any apparatus that may be installed in the grade level box and the locking assembly which is self-latching when the lid for the enclosure is simply placed atop the enclosure and forced downwardly to a locked position by applying foot pressure only to the top of the lid. The shielded locking system therefore prevents a conductive path from in the enclosure to outside the unit to prevent electrical shock when installing the lid or other unintentional contact from outside the enclosure.

SUMMARY OF THE INVENTION

Briefly, one embodiment of the invention comprises a shielded self-latching locking assembly for locking a lid to the top of a hollow enclosure. The locking assembly includes a spring-biased latch that engages a locking surface on the interior of the enclosure and a cover that separates and covers the locking assembly from interior components within the enclosure. The locking surface can be a rim or wall section of the enclosure or a recess formed in an inside wall of the enclosure. The locking assembly may be positioned on and adjacent to an edge of the lid. The locking assembly cooperates with the locking surface inside the lid to lock the lid to the top of the enclosure when the lid is placed over the enclosure and the latch is actuated by a downward force, such as foot pressure, for example, against the top of the lid.

One embodiment of the invention comprises a self-latching locking assembly positioned on an edge of a lid that removably mounts over an enclosure. The assembly includes an opening in an upper face of the lid which leads into a slotted housing on the underside of the lid. An L-bolt extends through the opening and into a passage in the slotted housing. A right-angle leg on the L-bolt protrudes below the bottom of the slotted housing. The L-bolt is rotatable by a tool that engages the L-bolt from outside the lid. A separate locking piece positioned inside the passage in the slotted housing retains the L-bolt in the slotted housing and prevents its removal from access outside the lid. The right-angle leg of the L-bolt engages a spring-biased self-latching slide member on the underside of the lid. The slide member is contained in a guide frame structure affixed to the underside of the lid adjacent the slotted housing that contains the L-bolt. The guide frame structure guides spring-biased axial travel of the slide member, which travels axially in the guide frame in unison with rotation of the L-bolt in the slotted housing. A latch carried on the slide member engages a lip or other abutment inside the enclosure when the lid is forced down over the opening in the enclosure. The latch retracts against the spring-bias as it travels over the lip or abutment and then snaps into engagement with a locking surface, such as a notch positioned on the inside of the enclosure below the lip. The latch retracts under the bias of the spring, and the spring force then causes the latch to snap into engagement with the locking surface as the latch travels past the lip or abutment inside the enclosure. This rotates the L-bolt to a spring-biased locked position. Rotation of the L-bolt in a direction away from the locked position retracts the slide member against the spring-bias. The L-bolt can be accessed from outside the enclosure, via a tool such as a socket wrench or the like, to rotate the L-bolt away from the locked position, retracting the latch against the bias of the spring, to allow removal of the lid. A cover is positioned over the locking assembly to cover all conductive components of the assembly including the L-bolt, spring and attachment fasteners thus separating any possible contact or current path out of the enclosure.

In another embodiment of the invention the self-latching locking assembly includes a simplified spring-biased self-latching slide member on the underside of the lid. The location and position of the slide member is controlled by a cover on the underside of the lid adjacent the slotted housing that contains the L-bolt. The cover guides spring-biased axial travel of the slide member, which travels axially within the cover in unison with rotation of the L-bolt in the slotted housing. A latch carried on the slide member engages a lip or other abutment inside the enclosure when the lid is forced down over the opening in the enclosure. The latch retracts against the spring-bias as it travels over the lip or abutment and then snaps into engagement with a locking surface, such as a notch positioned on the inside of the enclosure below the lip. The latch retracts under the bias of the spring, and the spring force then causes the latch to snap into engagement with the locking surface as the latch travels past the lip or abutment inside the enclosure. This rotates the L-bolt to a spring-biased locked position. Rotation of the L-bolt in a direction away from the locked position retracts the slide member within the cover against the spring-bias. The cover is positioned over the locking assembly to cover all conductive components of the assembly including the L-bolt, spring and attachment fasteners thus separating any possible contact or current path out of the enclosure.

Thus, the lid can be positioned over an opening in the enclosure, followed by simply applying downward force, such as foot pressure, for example, to automatically lock the lid in a secure, closed position, without using any tools for locking the lid and without concern of electrical shock. These and other aspects of the invention will be more fully understood by referring to the following detailed description and the accompanying drawings.

BRIEF DESCRIPTION OF THE DRAWINGS

FIG. 3 is a perspective view showing a guide frame according to principles of this invention.

FIG. 4 is a perspective view showing a slide member according to principles of this invention.

FIG. 5 is a fragmentary perspective view illustrating an L-bolt actuating device along with a bolt recess of a lid that contains a locking assembly according to principles of this invention.

FIG. 6 is a fragmentary perspective view, similar to FIG. 4, showing the L-bolt positioned in the bottom of the bolt recess.

DETAILED DESCRIPTION

Figure 1:
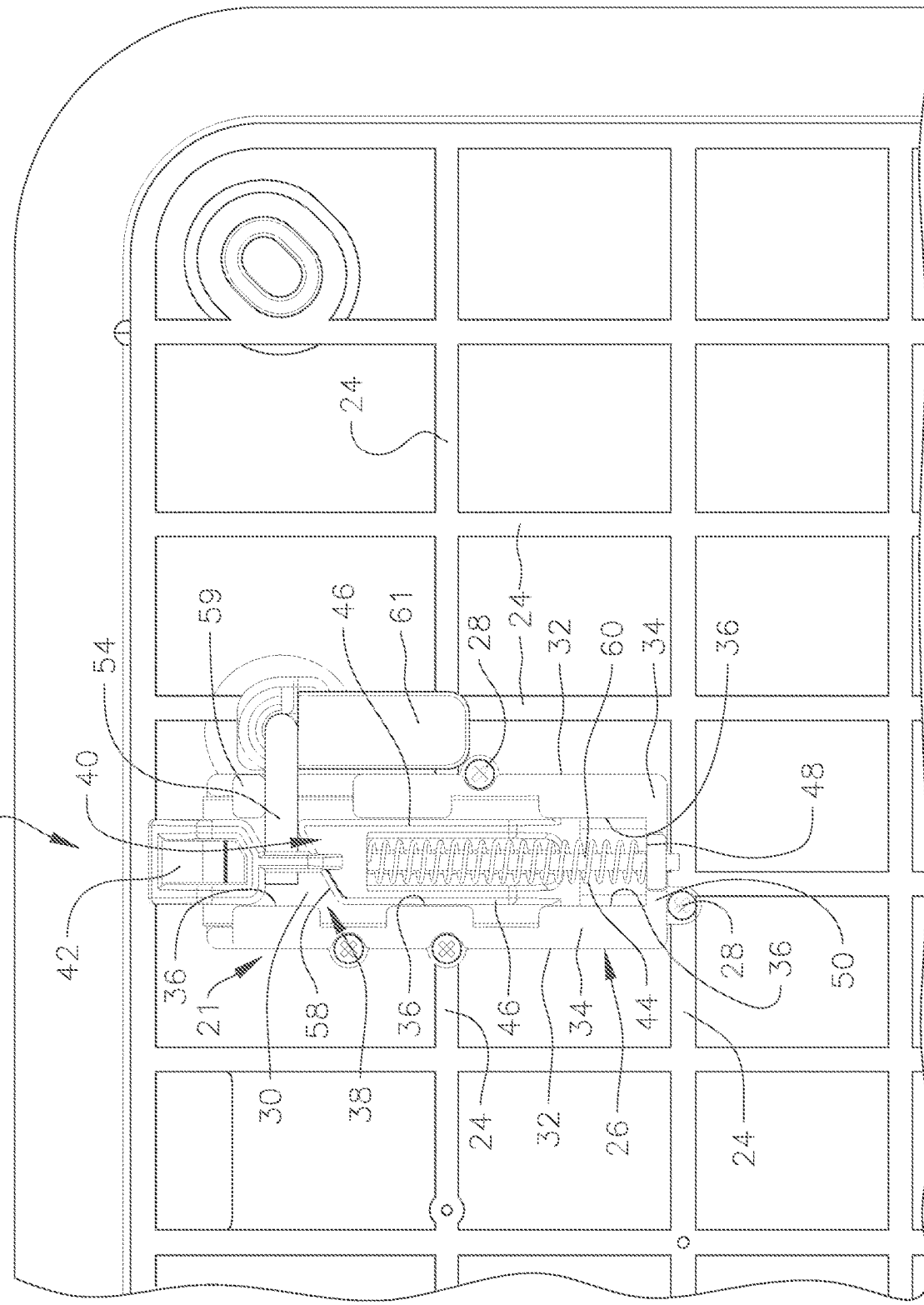
FIG. 1 is an elevational view showing a self-latching locking assembly according to principles to this invention. In this view, the shielding cover has been removed and a latch on the locking assembly is shown in a locked position on an underside of a lid for closing and locking an enclosure such as a grade level box.
Figure 2:
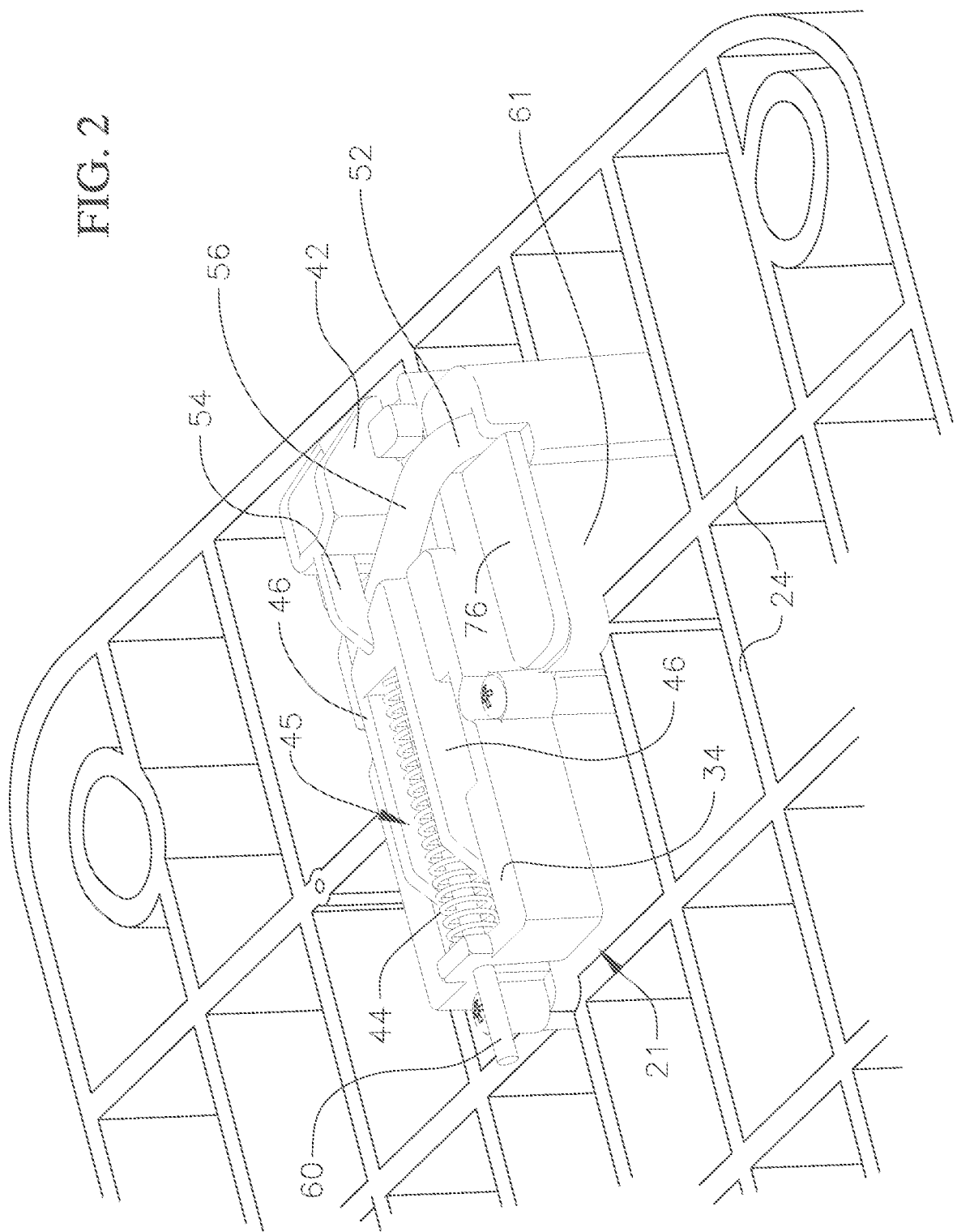
FIG. 2 is a perspective view of the locking assembly shown in FIG. 1 showing the latch in a retracted unlocked position.
Figure 7:
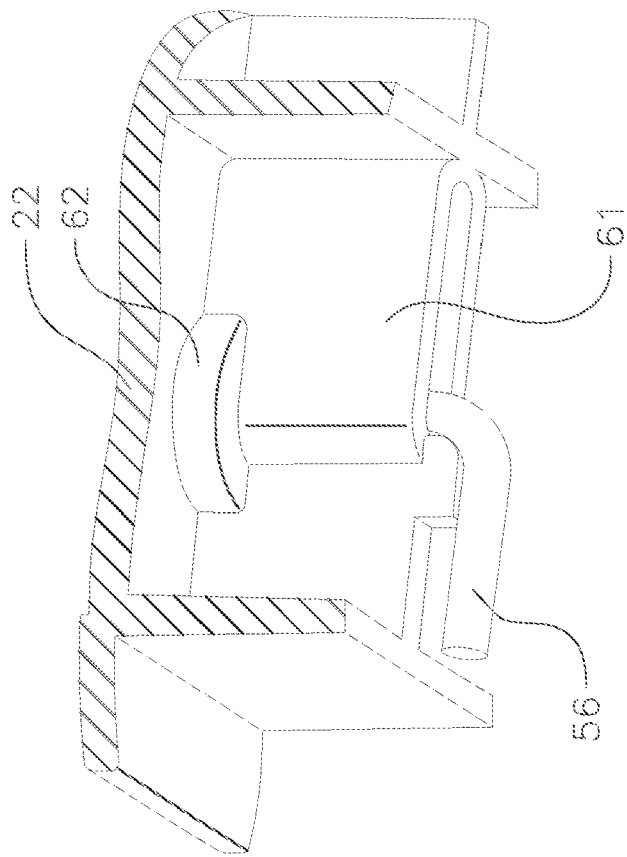
FIG. 7 is a perspective view taken from the underside of the lid and showing the L-bolt positioned in a slotted housing.

FIGS. 1 and 2 show a self-latching locking assembly 21 secured to an underside of a lid 22 that closes and securely locks an enclosure such as a grade level box. The locking assembly is shown in a locking position in FIG. 1 and in an unlocked position in FIG. 2. Both are described in more detail below. A cover for the locking assembly to be illustrated and discussed in more detail below is not for shown in these figures for a clearer understanding of the locking assembly.

The locking assembly is secured to a side portion of the lid so the latch portion of the locking assembly can engage a locking surface on an inside wall of the enclosure. The lid can be made from a molded thermoplastic or sheet molding compound material or other materials; and in one embodiment, the lid is adapted for closing and locking enclosures such as a grade level utility vault used to contain cable TV equipment, data transmission lines, telephone switching equipment, and other similar service lines, for example. The underside of the lid contains ribs 24 that project downwardly into the interior of the grade level box or other enclosure when the lid is in a closed position. The ribs can also run at right angles to form a grid structure, and the locking assembly can be secured to certain downwardly facing ribs adjacent an edge of the lid.

The locking assembly includes an elongated guide frame 26 affixed to the underside of the lid by fasteners 28. The guide frame details are best shown in FIG. 3. The guide frame has a flat base 30, a pair of upright, parallel left and right side walls 32 extending along opposite edges of the base, and a pair of inwardly projecting side rails 34 integrally formed with the side walls. The side rails have laterally spaced apart, parallel inside edges 36 extending along opposite sides of a generally rectangular open space 38 facing outwardly from the guide frame structure. The base, side walls and side rails of the guide frame are formed as a molded integral piece made from a hard plastic material such as polypropylene.

The open space within the guide frame contains a slide member 40 adapted for spring-biased axial travel inside the guide frame. The slide member details are best shown in FIG. 4. The open space within the guide frame is shaped as a generally T-shaped channel in cross-section, and the slide member 40 has a conforming T-shaped cross-sectional configuration adapted for axial travel, guided by the T-shaped base and side wall structure of the guide frame 26.

The slide member 40 is divided into three sections:

(1) A front section includes a tapered latch 42 which travels axially toward or away from a locking position, in response to axial extension or retraction of the slide member inside the guide frame. The latch is carried on, or integrally formed with, a front portion of the slide member 40.

(2) A rear section includes an upwardly opening generally U-shaped channel 45 which contains a spring member 44. The channel is formed by narrow parallel side walls 46 that slide against the side rails 34 on opposite sides of the guide frame. The slide member is generally T-shaped in cross-section and is configured so a flat base 47 of the slide member slides on the flat base 30 within the guide frame. A rear face 48 of the slide member engages a rear wall 50 of the guide frame which acts as a stop when the slide member retracts its full extent in the channel portion of the guide frame. Side flanges 51 on the base portion of the slide member slidably engage the recessed area under the inwardly projecting side rails 34 of the guide frame.

(3) An intermediate section includes a connection to an L-bolt 52 that rotates in unison with axial travel of the slide member 40. In the illustrated embodiment, the slide member's L-bolt connection comprises an opening 54 formed in the slide member so as to face laterally outwardly for contact with a right-angle leg 56 of the L-bolt. (The L-bolt is described in more detail below.) The opening 54 is positioned adjacent an angular face 58 formed on the intermediate section of the slide member between the spring-containing channel 45 on the rear section and the latch 42 on the front section of the slide member. The right-angle leg 56 of the L-bolt fits loosely within the opening 54. In use, rotation of the L-bolt can rotate the right-angle leg against the angular face 58 to push the slide member toward a retracted position against the bias of the spring member 44. When the spring tension is released, the slide member slides forward to the locking position. The right-angle leg of the L-bolt rotates in unison with the slide member's forward motion. A projection 59 on the guide frame is contacted by the leg portion of the L-bolt to stop forward travel of the slide member.

The spring member 44 is positioned in the channel 45 within the slide member 40. In the illustrated embodiment, the spring member comprises of coil spring, although other means of applying axial spring force the end of the slide member can be used. The coil spring is positioned on an elongated metal or plastic rod 60 that extends axially through the center of the channel. A front portion of the rod is affixed to an intermediate portion of the slide member at the front of the channel. A rear portion of the rod passes through an opening in the rear wall 50 of the guide frame. The rod extends along the center of the coil spring to align the coil spring axially within the channel. Retraction of the slide member within the guide frame causes the alignment rod to project out from the rear wall of the guide frame as shown in FIG. 2. In its normal state, the spring is in tension between the front of the channel and the rear wall of the guide frame 26.

FIGS. 1 and 2 show the L-bolt 52 contained in a slotted housing 61 affixed to the underside of the lid 22. The L-bolt and its slotted housing can be similar to the L-bolt locking assembly shown in Applicant's U.S. Pat. No. 7,547,051, the entire disclosure of which is incorporated herein by this reference.

Referring to FIGS. 5 to 8, the top of the lid 22 has a cup-shaped bolt recess 62 that opens to the top of the lid and projects downwardly toward the underside of the lid. The bottom of the bolt recess includes a long, narrow slotted housing 61 that communicates with the opening through the lid. A bottom portion of the bolt recess communicates with the opening through the slotted housing. The L-bolt is inserted at an angle, as shown in FIG. 5, into an opening in the bolt recess. A locking nut 64 and lower flange 66 are integrally formed with the top of the bolt. The L-bolt shaft is bent to form the right-angle leg. The right-angle leg of the L-bolt is pushed down into the bottom of the bolt recess as shown in FIG. 5, and is then straightened and pushed to the bottom of the recess as shown in FIG. 6. The right-angle leg of the L-bolt extends parallel to and is spaced below of the bottom of the slotted housing. The L-bolt can be rotated to rotate the right-angle leg through an angular range of motion described in more detail below.

Figure 8:
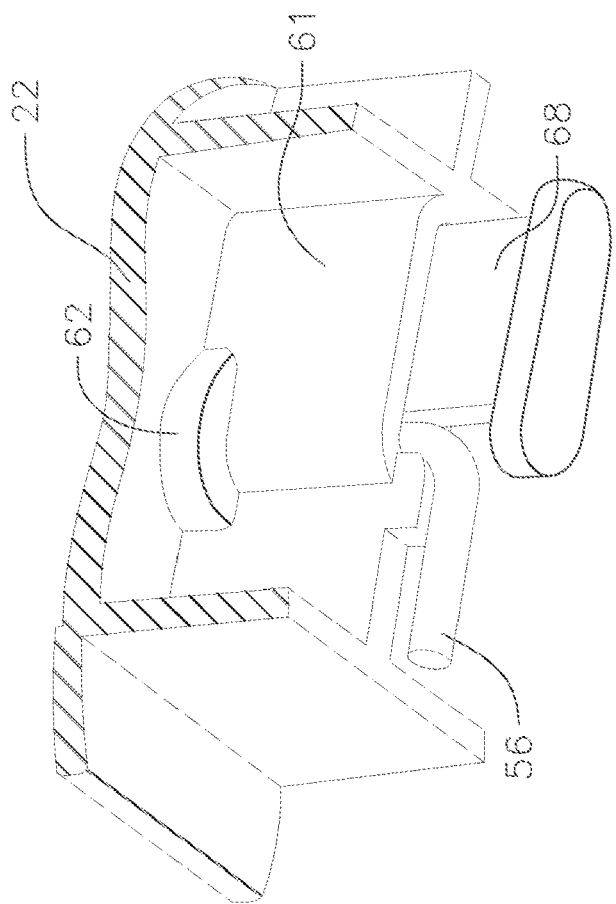
FIG. 8 is a perspective view showing a locking piece in the process of being inserted into the slotted housing portion of the locking assembly.

FIG. 8 shows one embodiment, in which a molded plastic locking piece 68 can be inserted into the bottom opening in the slotted housing. The locking piece 68 is then driven up into the slotted housing where it extends adjacent to the L-bolt shaft. The locking piece makes a sliding fit into the opening through the slotted housing. The bottom of the locking piece has a flanged portion that fits around a bottom edge of the housing when the locking piece is in place in the opening through the housing.

Figure 9:
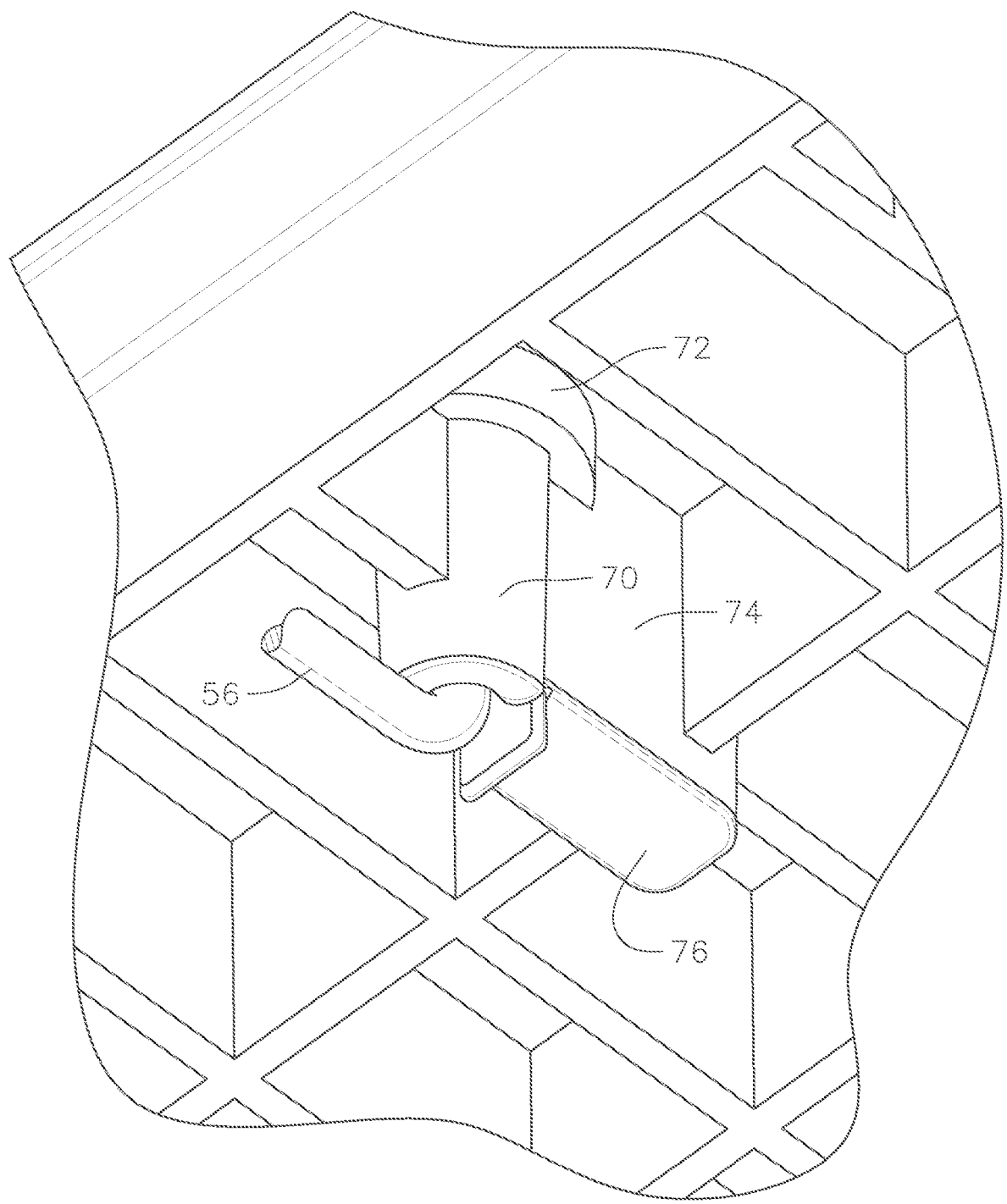
FIG. 9 is a fragmentary bottom perspective view showing an alternative embodiment of an L-bolt actuating device useful in the locking assembly of this invention.
Figure 10:
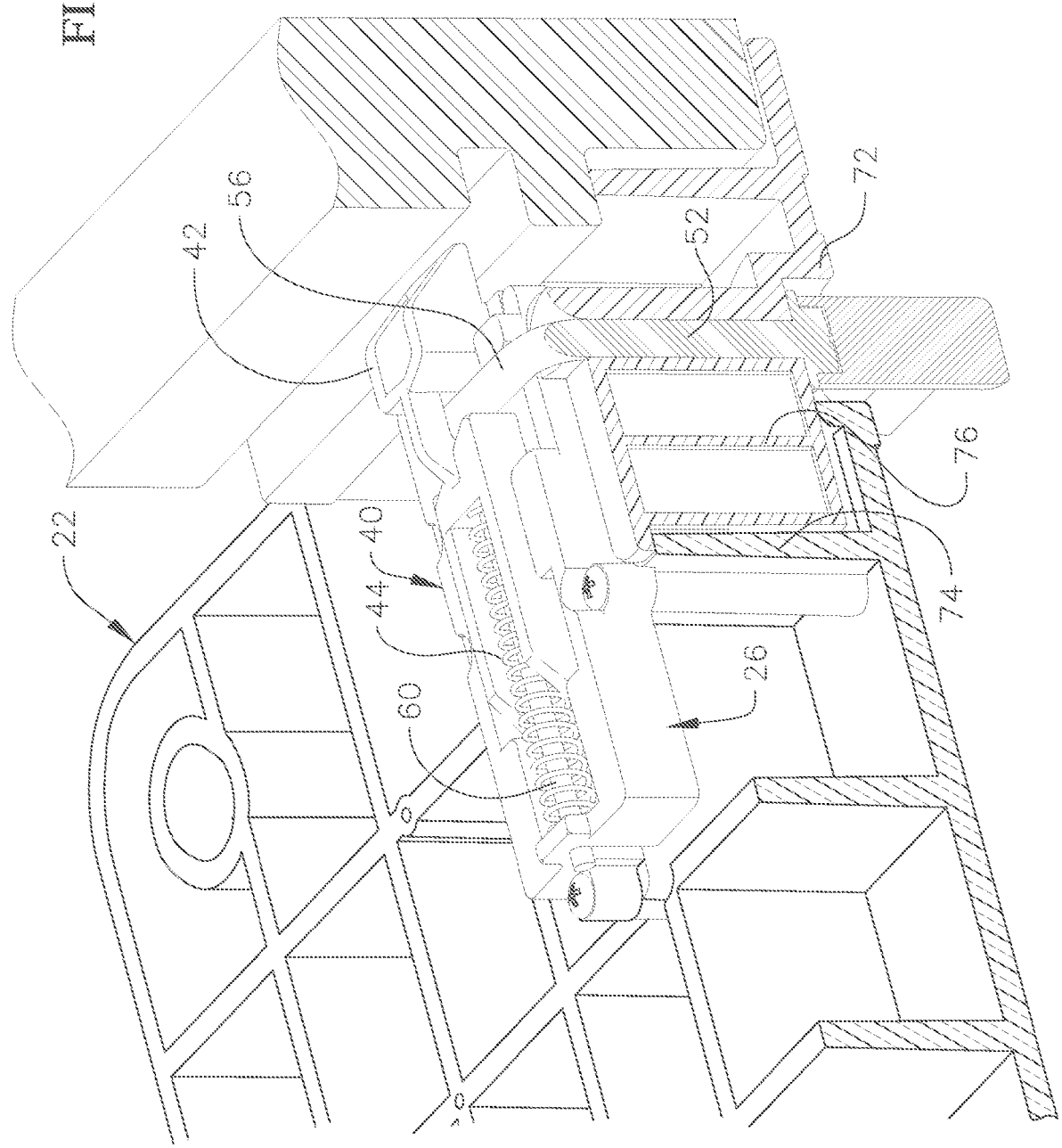
FIG. 10 is a fragmentary perspective view, partly in cross-section, of the assembly shown in FIG. 9.

FIGS. 9 and 10 show an alternative form of the L-bolt assembly. In this embodiment, the upright shaft 52 of the L-bolt extends downwardly through a cylindrical housing 70 which extends below a cup shaped recess 72 exposed to the upper surface of the lid. The cylindrical housing and recess are integrally molded with the top plate surface of the lid. The locking nut 64 at the top of the shaft is disposed in the recess 72 for access from the top side of the lid. The right-angle leg 56 at the bottom of the L-bolt extends laterally away from the bottom of the cylindrical housing 70. An elongated slotted housing 74, which is integrally molded with the cylindrical housing, contains a locking piece 76 disposed in the housing for retaining the L-bolt in the housing 70.

Figure 11:
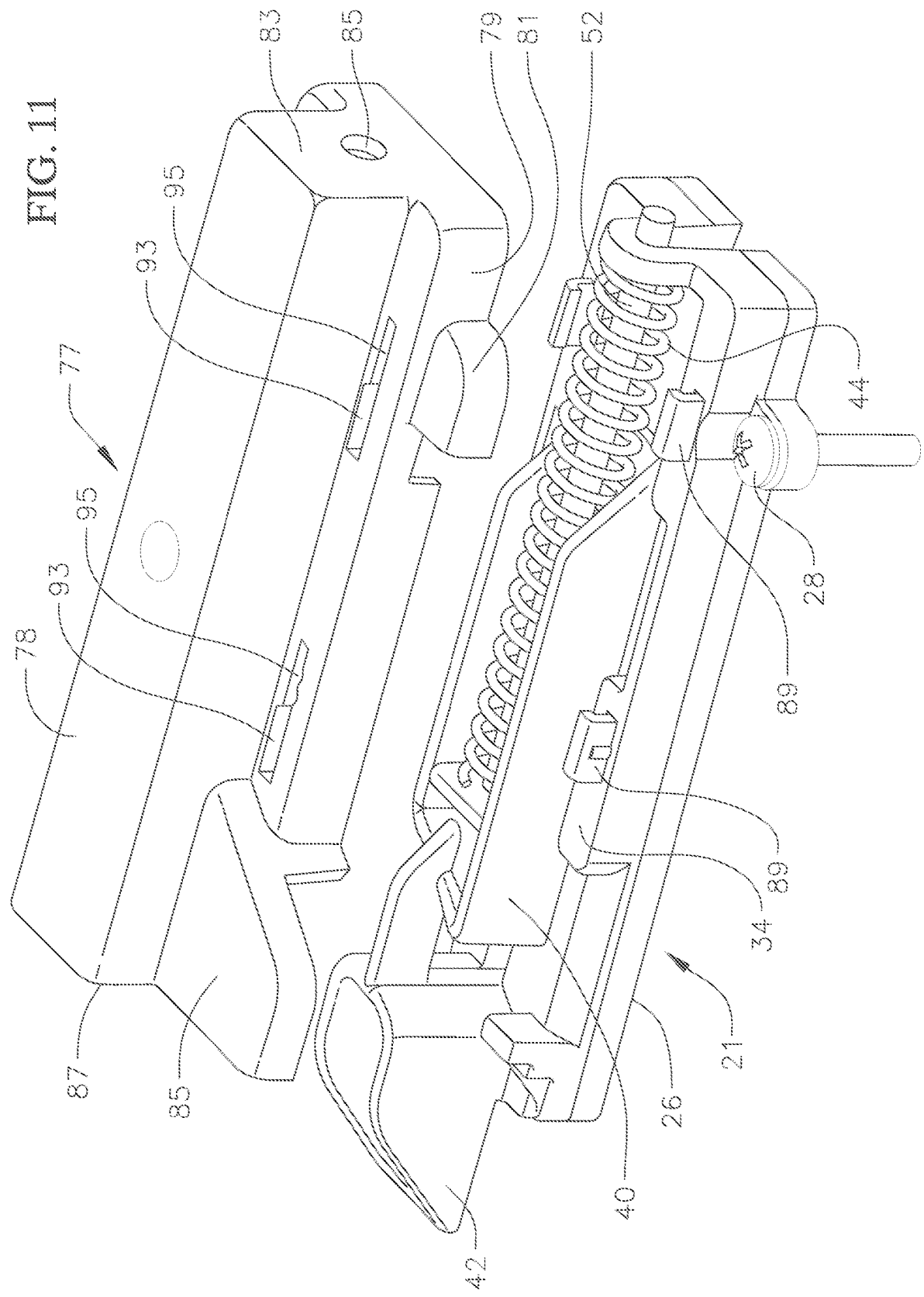
FIG. 11 is an exploded perspective view of the locking assembly and cover therefore.
Figure 12:
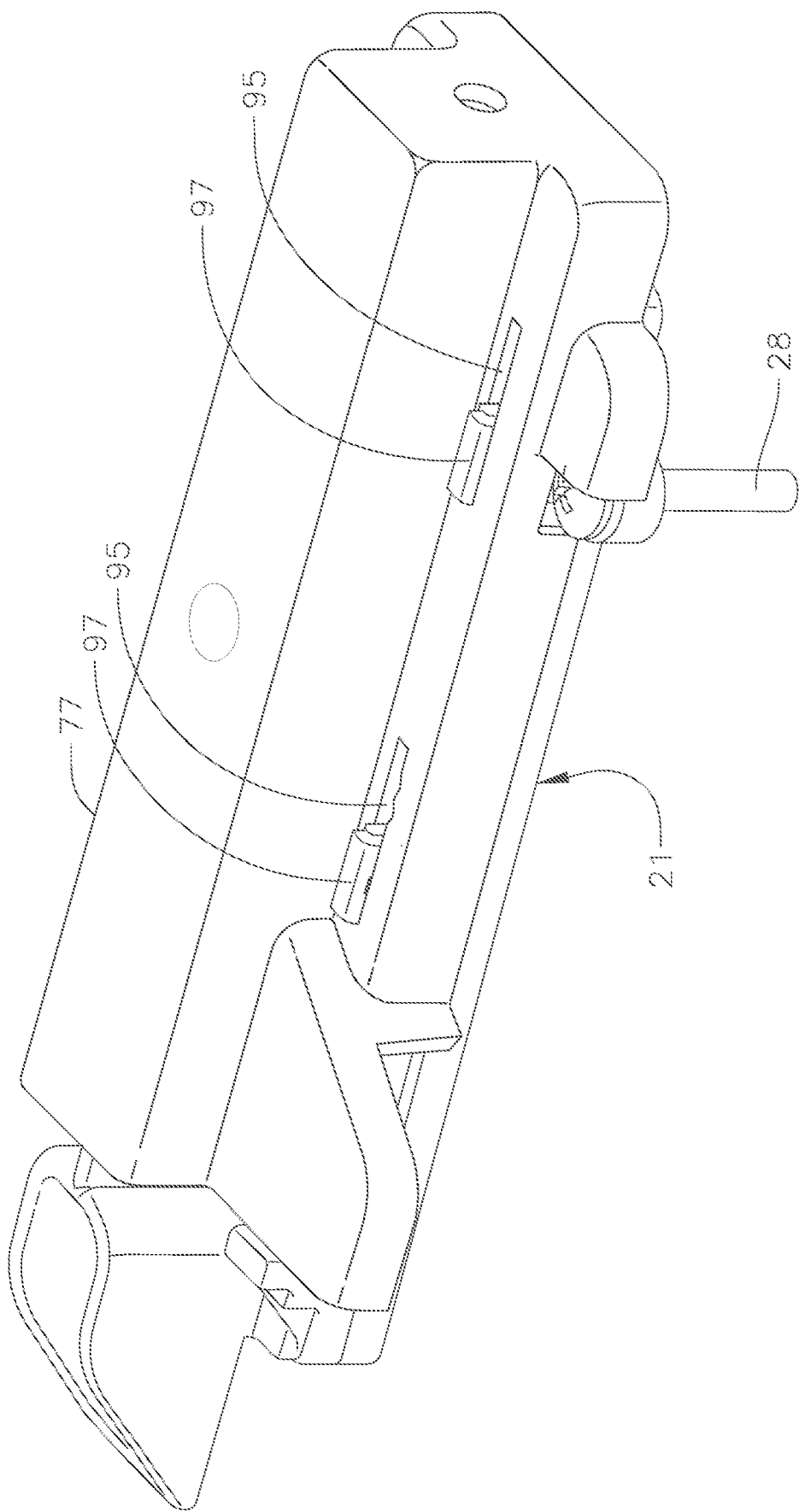
FIG. 12 is a perspective view of FIG. 11 showing the cover as initially installed on the locking assembly.
Figure 13:
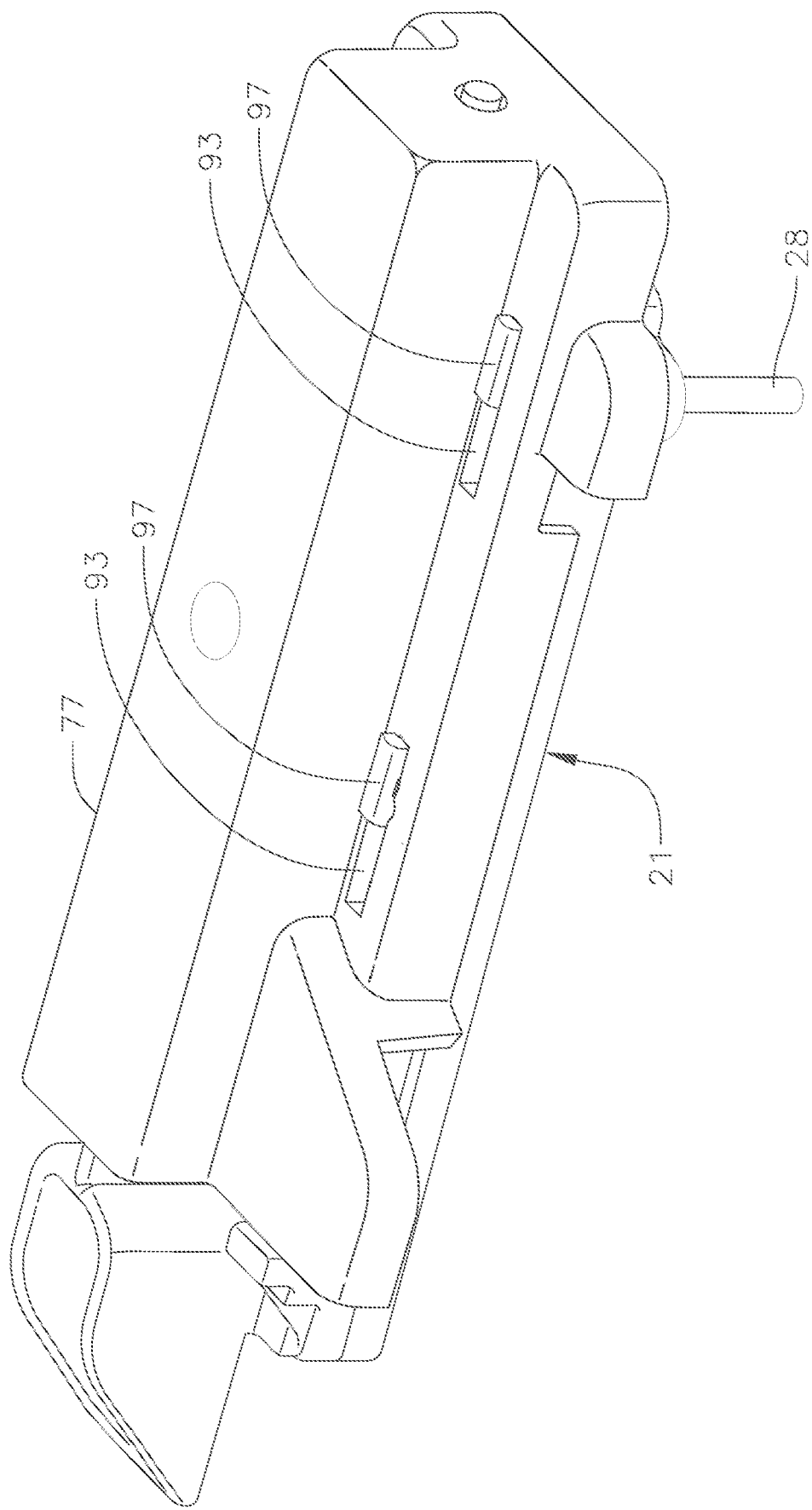
FIG. 13 is a perspective view of FIG. 12 showing the cover as installed in a final position on the locking assembly.

FIGS. 11 to 13 illustrate a cover 77 for placement over the locking assembly 21. The cover 77 has a profile that separates and covers the attachment fasteners 28, spring member 44 and the actuating L-bolt 52 from the interior of the utility vault 80 and any equipment contained therein thus separating any possible contact or current path to the outside from inside the vault. In the utility market it is important and required that there is no metallic or conductive contact between the apparatus that may be installed in the enclosure and the outside of the unit. The cover 77 shields contact from any conductive components of the locking assembly and further shields the mechanisms from incidental contact during use, and during installation or removal of the cover plate or lid from the vault.

The cover 77 include a top portion 78 shaped to fit over the enclose the slide member 40 and a bottom portion 79 shaped to fit over the guide frame 26. The bottom portion 79 include fastener portion 81 shaped to fit over fasteners 28. An end wall 83 is positioned at one end of the cover and includes a hole 85 for receipt of an end of L-bolt 52 when positioned over the locking assembly. The cover also includes a flange portion 85 to allow operation of the right-angle leg 56 of the L-bolt 52. End 87 of cover 77 is open so that latch 42 can operate during installation and removal of the lid.

Tangs 89 are positioned on the side rails 34 on either side of the of the guide member 26 and extend upwardly for passage through recesses 91 on either side of the bottom portion 79 of the cover. Recesses 91 have a wider portion 93 and a narrower portion 95 adjacent one another. As illustrated in FIG. 12, to attach the cover 77 to the locking assembly, the cover 77 is positioned over and lowered onto the locking assembly so that tangs 89 extend through the wider portion 93 of recesses 91 with a top curved lip portion 97 of the tangs protruding out and above the wider portion. As shown in FIG. 13 the cover 77 is then moved towards the latch 42 so that the tangs move to the narrower portion 95 of the recesses 91 and the top lip portion 97 of the tangs engages a top surface of the bottom portion 79 to firmly attach the cover to the locking assembly.

Figure 14:
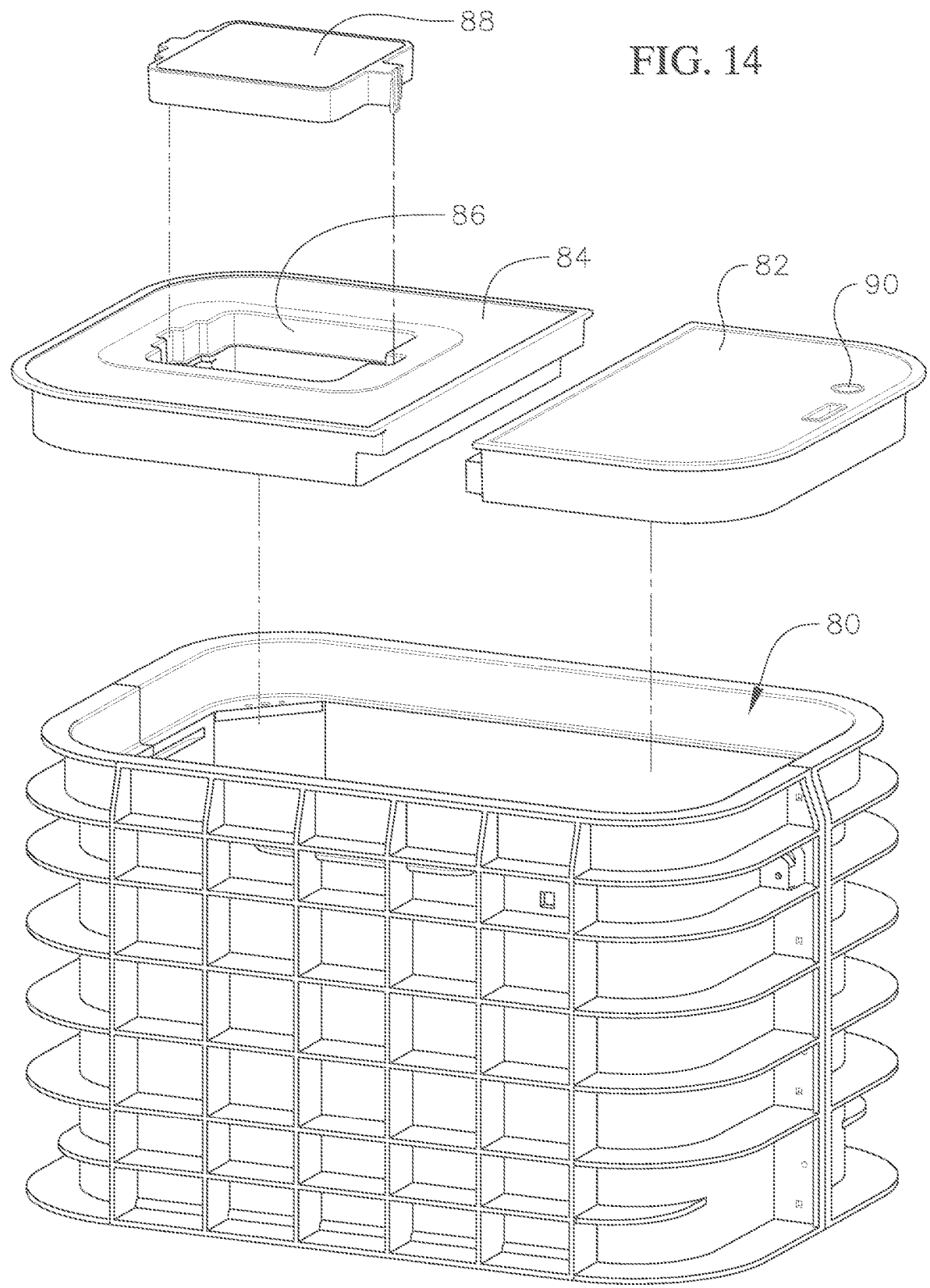
FIG. 14 is a perspective view showing a grade level box and a cover plate assembly which contains a locking device of this invention for use in locking the cover plate to the top of the grade level box.

FIG. 14 shows an example of a grade level box or utility vault 80 having an upper opening that receives a cover plate or lid that encloses and securely locks the top of the vault. The lid can comprise a solid cover plate, such as cover plate 22, for enclosing the entire opening; or the lid can be a split cover plate having two sections 82 and 84, as illustrated in FIG. 14. In this instance the lid contains a plug opening 86 and a removable plug 88 for receiving a pedestal housing (not shown). The embodiment in FIG. 14 shows a recess 90 near an edge of the cover plate section 82 which contains the L-bolt connection to the locking device positioned on the underside of the lid. When the cover plate is positioned in the opening of the grade level box, the lid can be locked in place by the progression of steps shown in FIGS. 15 through 19.

Figure 15:
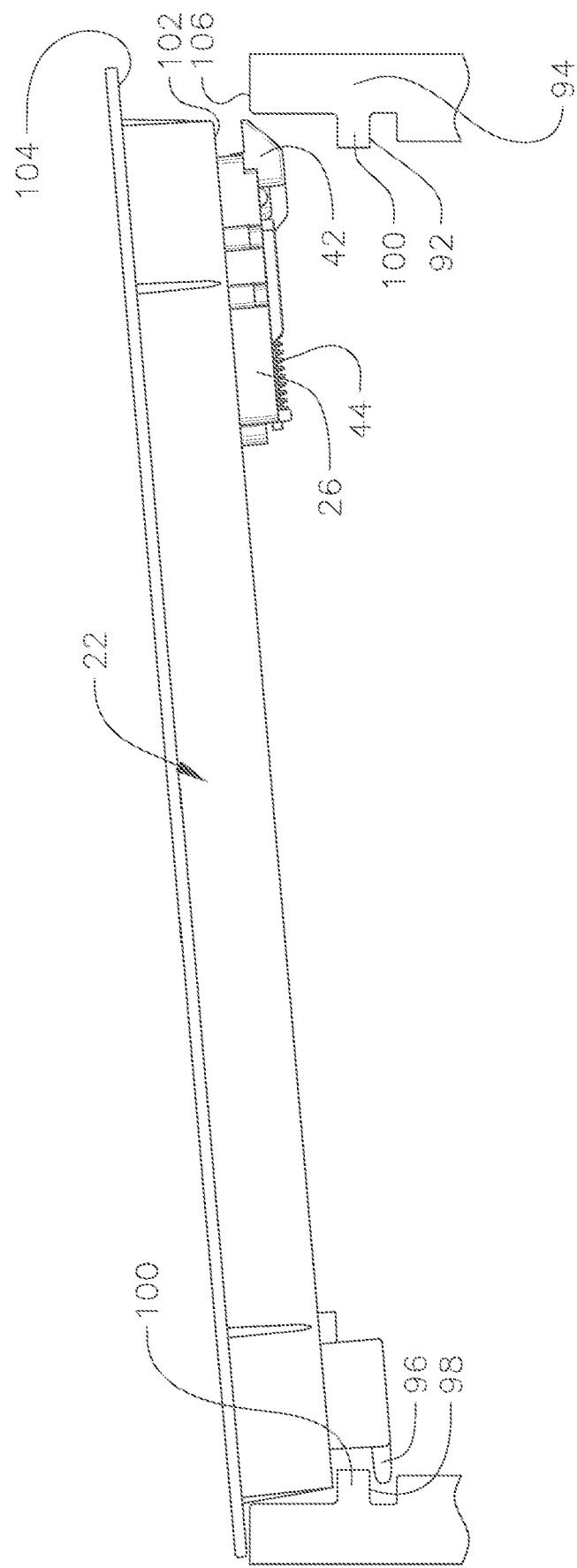
FIG. 15 is a fragmentary side elevational view showing a lid for a grade level box with the locking assembly in an unlocked position prior to the lid being moved to a locked position.

FIGS. 15 to 19 show the locking assembly in use. In these figures, the cover 77 is not shown for better understanding of the operation of the locking assembly, it is to be understood that a cover would be positioned on the locking assembly as shown in FIG. 13. FIG. 15 shows the lid 22 positioned above the opening in the enclosure, in its unlocked position, with the latch assembly spaced above a locking surface 92 inside a wall 94 of the enclosure. A side of the lid, opposite the locking assembly, can include a fixed detent 96 that engages a notch 98 or other recess beneath a rim 100 that extends around the inside of the enclosure. A downwardly projecting lip 102 on an underside of the lid normally rests on a top surface of the inside rim 100, when the lid is closed. The lid also includes a flanged outer periphery 104 that rests atop an upper edge 106 of the enclosure when the lid is ultimately moved toward the closed position.

Figure 16:
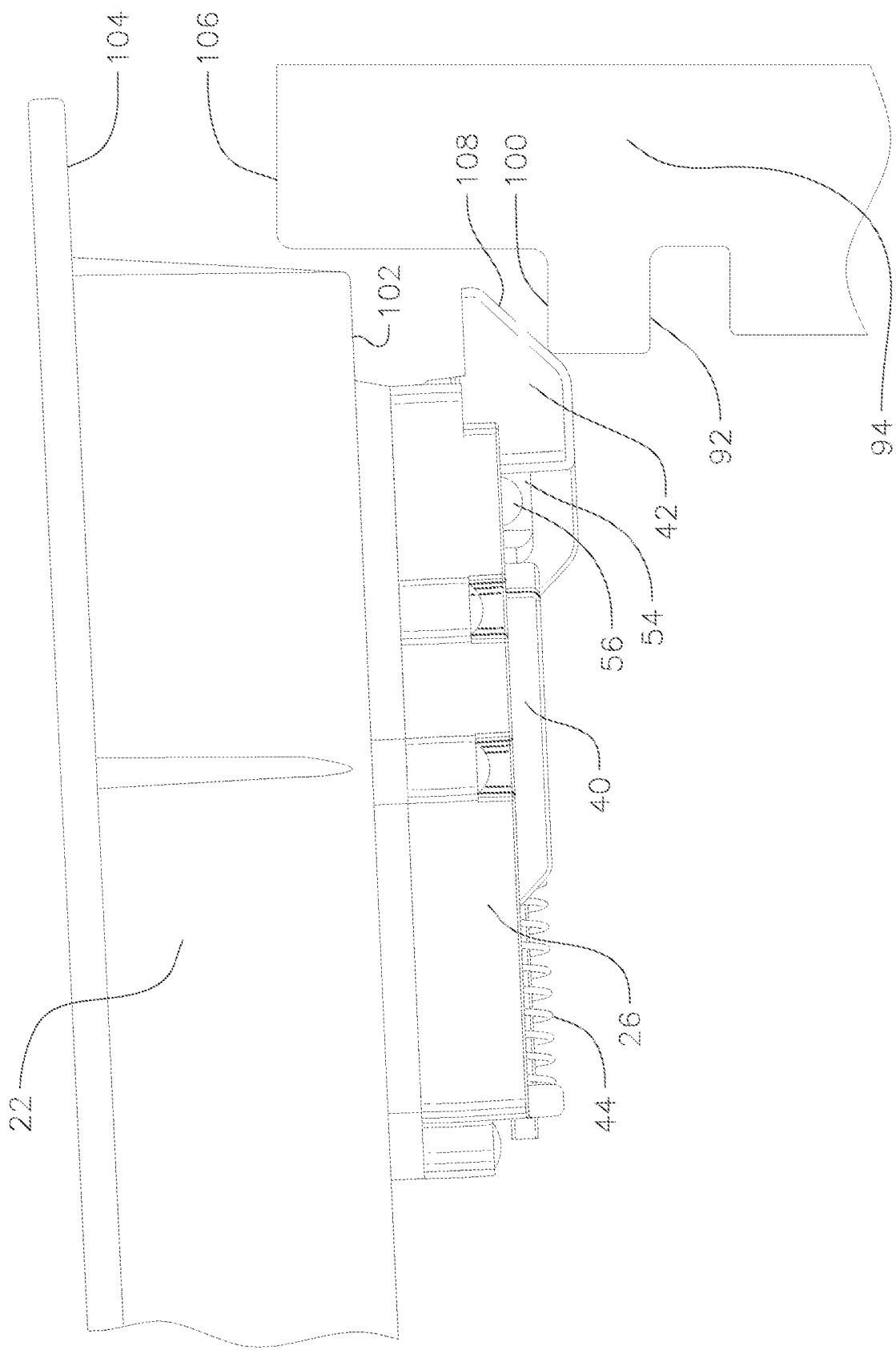
FIG. 16 is a side elevational view, partly in a cross-section, showing the lid for the grade level box, with the lid containing the self-latching locking assembly in an unlocked position.

FIG. 16 shows a progression of the lid moving toward its locked position under a downward force applied to the top of the lid. Here, the latch portion of the locking assembly is engaged with an outer edge of the rim 100 as the lid is moved down toward the locked position. Initial contact in this instance is between the rim and the bottom portion of the taper 108 that extends at an angle along the outer edge of the latch 42. The latch is spring-biased outwardly to its unlocked position by the spring tension applied to the end of the slide member 40.

Figure 17:
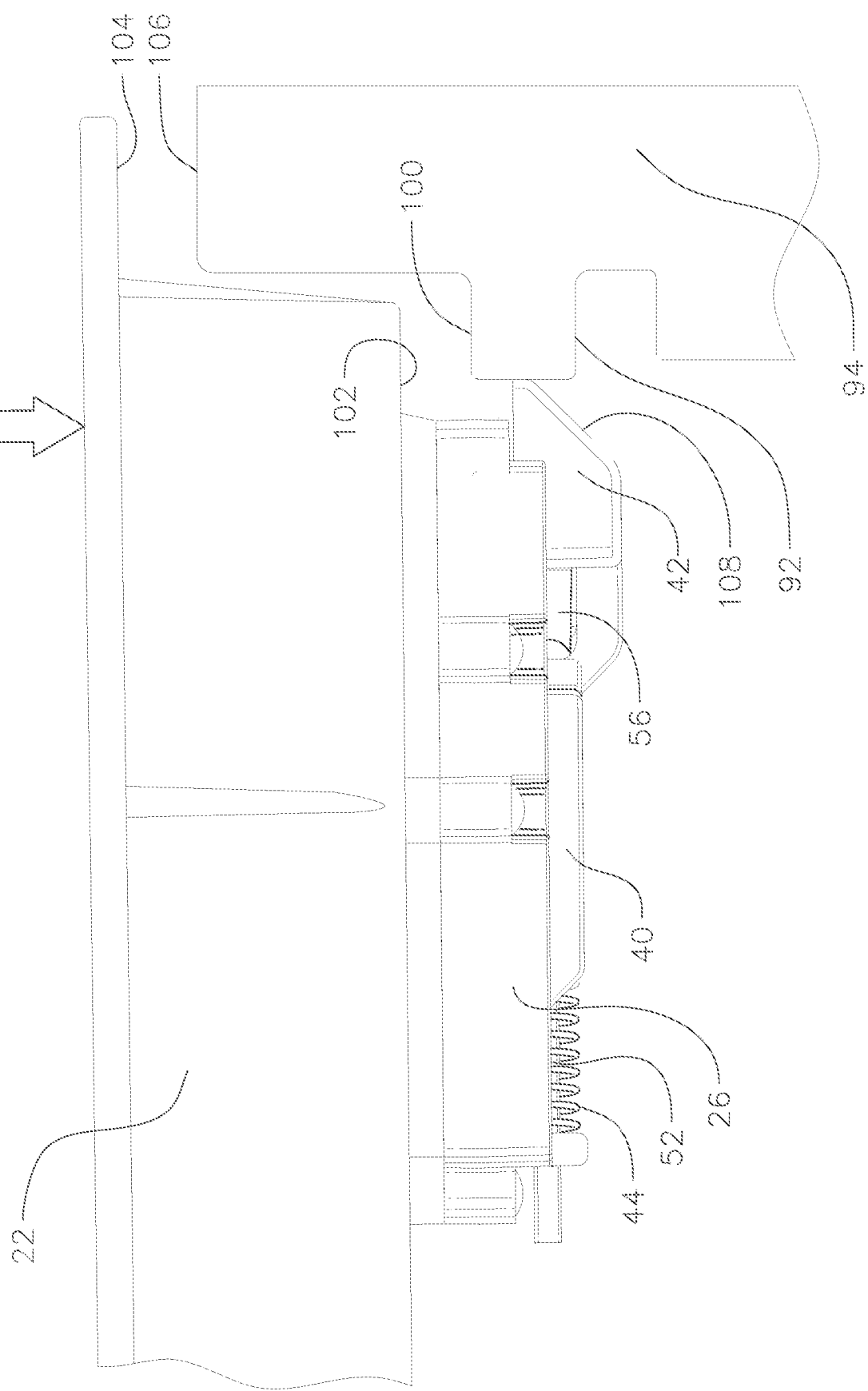
FIG. 17 is a side elevational view similar to FIG. 16 showing the self-latching locking assembly in the process of being locked and with the latch in a retracted position.

FIG. 17 shows an intermediate step in the progression toward the locked position under the downward force applied to the lid. Here, the front end of the latch 42 is engaged with the inner edge of the rim 100, causing the latch to retract inwardly against the spring-bias, guided in its axial travel by the side rails of the guide frame 26. In the position shown in FIG. 17, the latch applies a spring-biased tension force against the inside face of the rim. Also, retraction of the slide member into the guide frame causes the L-bolt shaft 52 to rotate in unison with the axial travel of the slide member against the bias of the spring. The L-bolt shaft rotates in response to the right-angle leg 56 of the L-bolt rotating through an angle via its connection to the slide member 40. During retraction of the slide member, the end face of the slide member engages the rear wall of the guide frame 26 which acts as a stop against further axial travel against the spring-bias.

Figure 18:
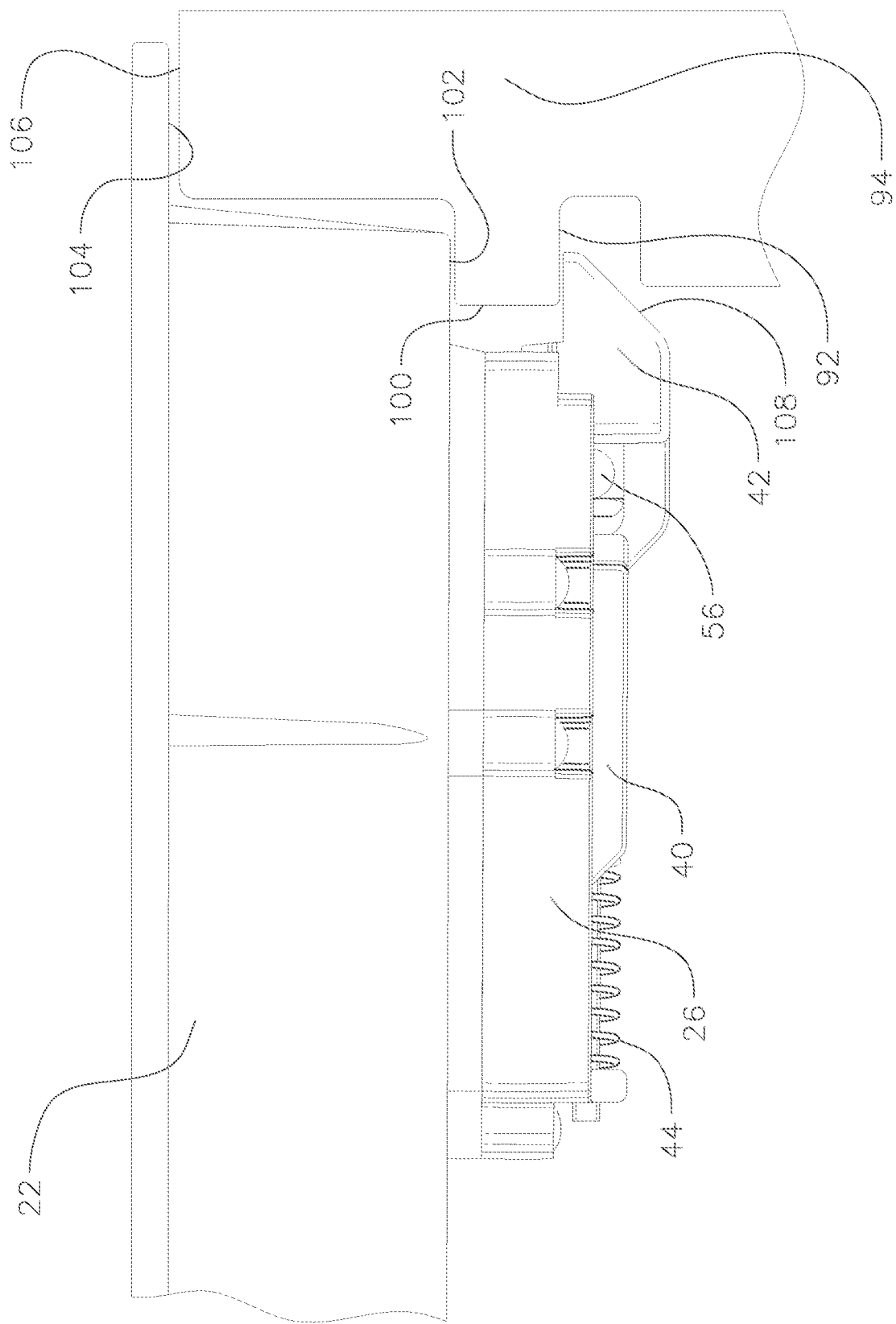
FIG. 18 is a side elevational view similar to FIGS. 16 and 17 but showing the self-latching locking assembly in a locked position.

FIG. 18 shows the latch assembly having moved to its locked position. Here, the downward force applied to the top of the lid has caused the tapered edge 108 of the latch 42 to release from contact with the rim 100, once the lid reaches its closed position against the top 106 of the enclosure as shown in FIG. 18. This causes the spring 44 to force the slide member 40 to move forward with a snap action, with the latch automatically forced into engagement with the notch 92 located under the rim. During this forward motion of the slide member and the latch, the L-bolt rotates in unison with the slide member, owing to the connection between the right-angle leg 56 of the L-bolt and the slide member.

In the latched position shown in FIG. 18, the lid is securely locked in the closed position on the enclosure, with the spring biased latch preventing removal of the lid. In the locked position, the top of the L-bolt provides the sole means of access to the enclosure. Here, the L-bolt has been rotated to a locking position, and the locking piece disposed in the slotted housing adjacent the L-bolt shaft prevents removal of the L-bolt from the exterior of the enclosure.

Figure 19:
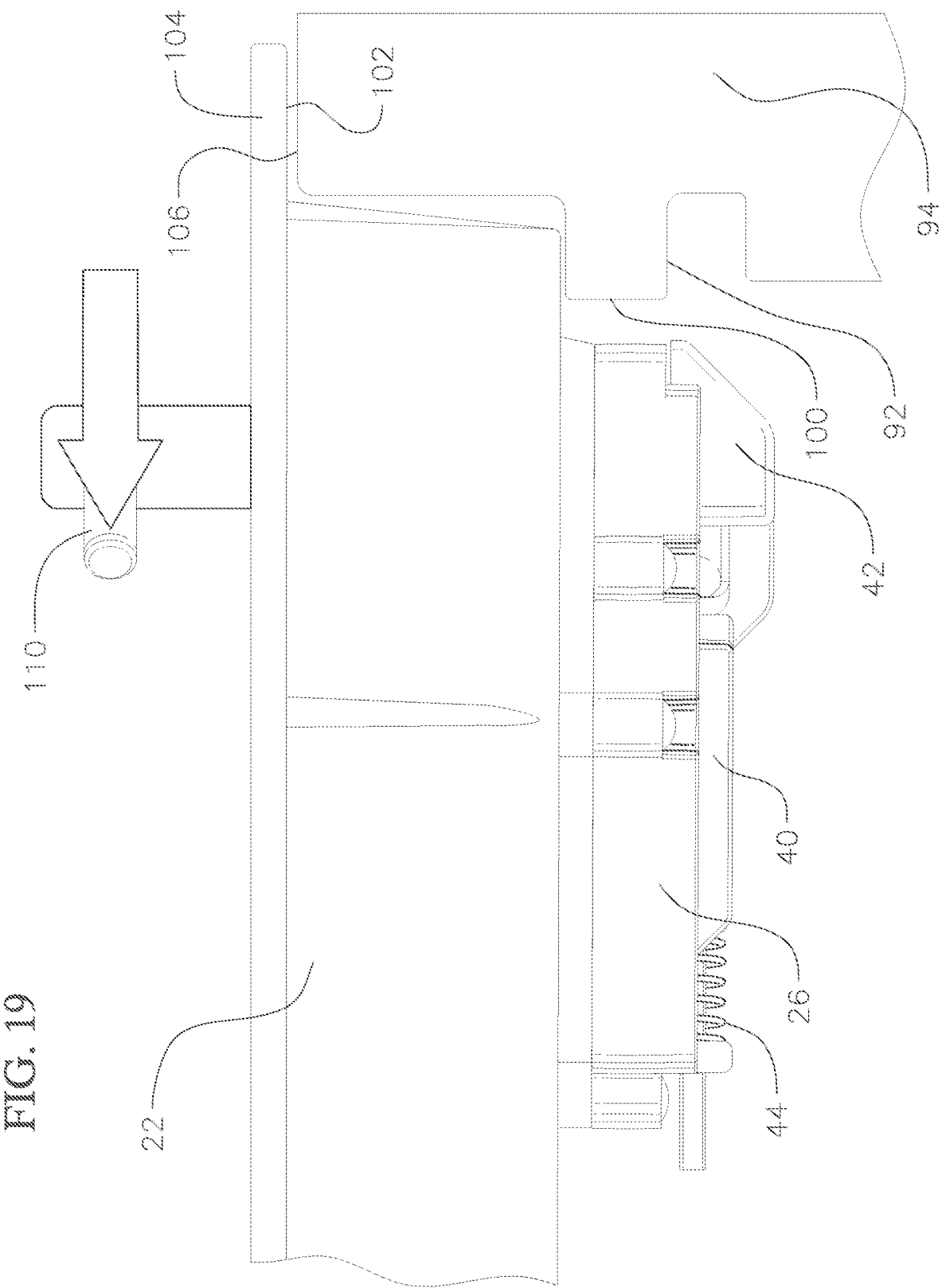
FIG. 19 is a side elevational view showing the latch of the locking assembly retracted to an unlocked position, via rotation of the L-bolt.

FIG. 19 illustrates gaining access to the enclosure. Here, a socket wrench 110, or other tool, can be used to engage the nut atop the L-bolt, for rotating the L-bolt away from its locking position. The L-bolt connection to the slide member causes the slide member to retract into the guide frame against the spring-bias and move the latch away from its locked position, as shown in FIG. 19. This provides an unlatched means of removing the lid from the enclosure.

Thus, the slide member is engaged in its locked position when the lid is forced down over the opening enclosure, such as by foot pressure. Downward force on the lid progressively causes the latch to retract the spring-bias from contact with the abutment and then snaps the latch into the spring-biased locking position. The L-bolt can be accessed from outside the lid, rotated by the socket wrench or similar proprietary tool, to retract the latch from its locking position sufficiently for removing the lid from the enclosure.

FIGS. 20 through 23 show an alternative embodiment a self-latching locking assembly 200 secured to an underside of a lid 22 that closes and securely locks an enclosure such as a grade level box. The locking assembly is shown in a locking position in FIG. 22 and in an unlocked position in FIG. 23.

The locking assembly includes an elongated cover 202 affixed to the underside of the lid by fasteners 28. The cover has a base 204, a pair of upright, parallel side walls 206, 208 extending along opposite edges of the base, and an end wall 210. The end of the cover opposite of end wall 210 is open. Side walls 206, 208 and end wall 210 along with the base 204 define a channel 212 or open space for receipt of a slide member 214. A rib wall 216 extends into the channel from end wall 210. The cover and slide member are formed are molded pieces made from a hard plastic material such as polypropylene although could also be made from other materials.

The channel or open space within the cover contains the slide member 214 for spring-biased axial travel inside the cover. The channel or open space within the cover is generally rectangular in shape and the slide member 214 has a conforming rectangular shape adapted for axial travel, guided by the base and side walls structure of the cover.

Figure 20:
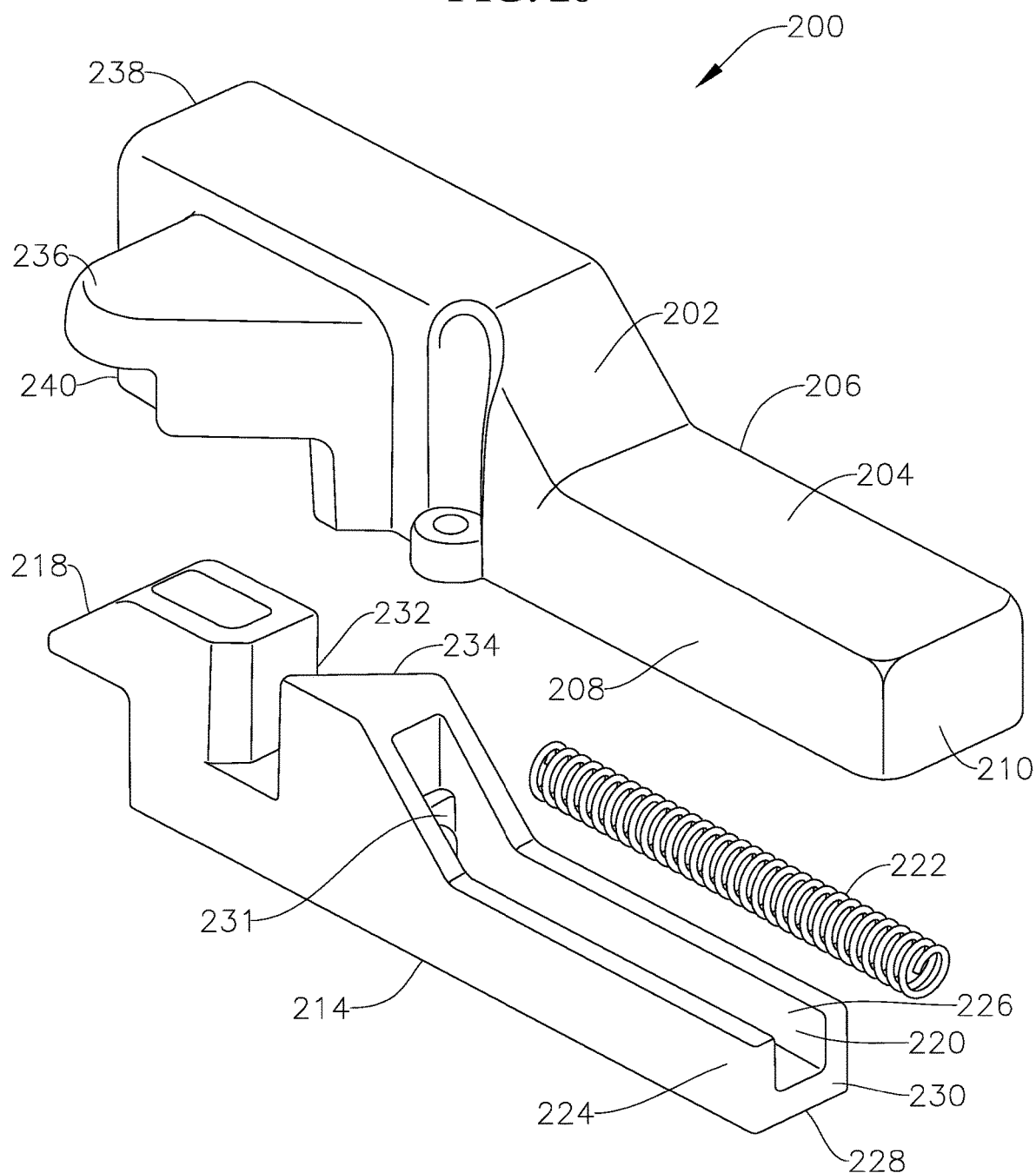
FIG. 20 is an exploded perspective view of an alternative embodiment slide member and cover for s self-latching locking assembly.
Figure 21:
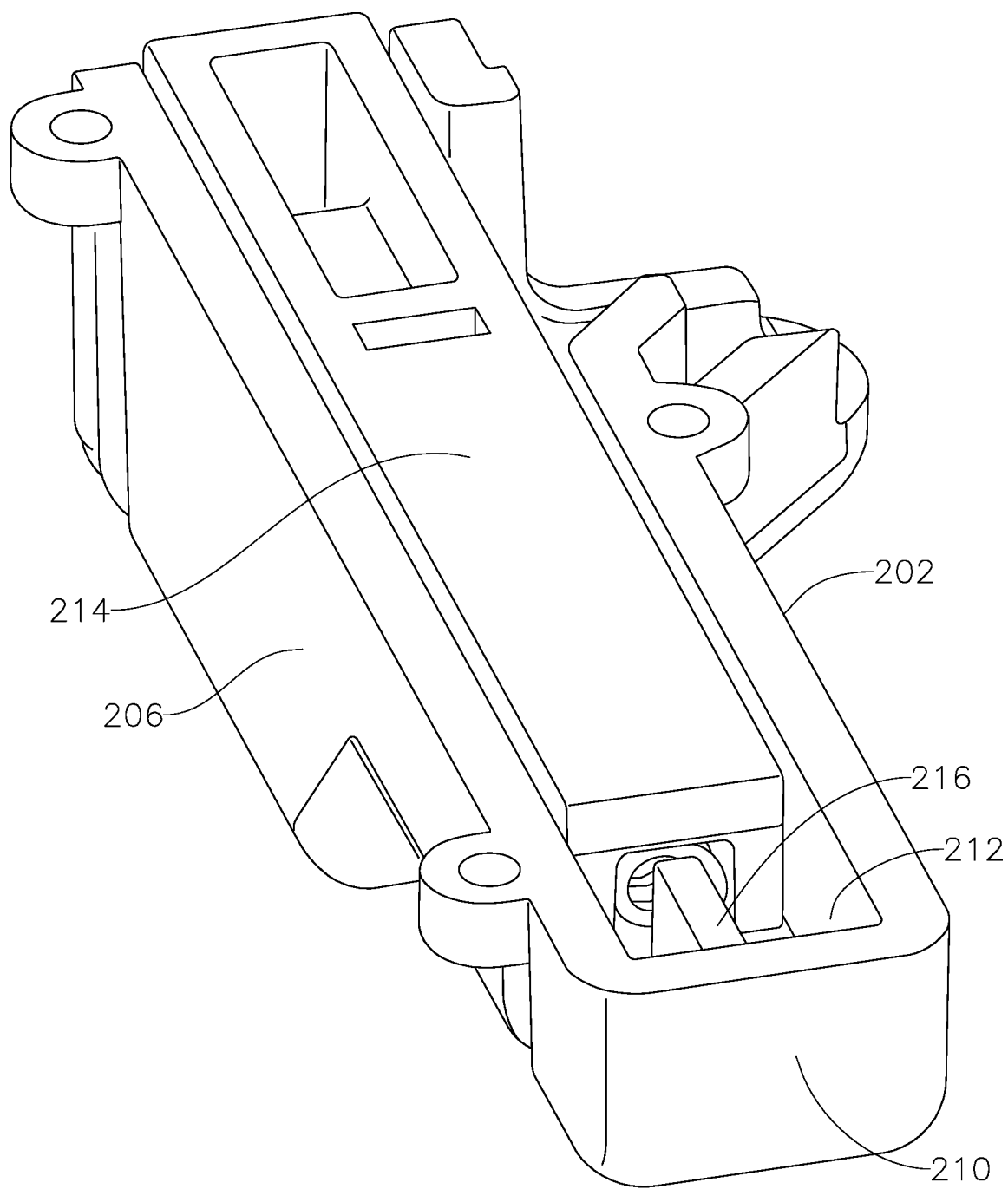
FIG. 21 is an underside view of the slide member and cover of FIG. 20.

As shown best in FIG. 20, the slide member 214 is divided into three sections:

(1) A front section includes a tapered latch 218 which travels axially toward or away from a locking position, in response to axial extension or retraction of the slide member inside the channel of the cover. The latch is carried on, or integrally formed with, a front portion of the slide member.

(2) A rear section includes an upwardly opening generally U-shaped channel 220 which contains a spring member 222. The channel is formed by narrow parallel side walls 224, 226 that slide against the side walls 206, 208 on opposite sides of the cover. The slide member is generally rectangular in cross-section and is configured so a flat base 228 of the slide member slides on the flat base 204 within the channel of the cover. A rear face 230 of the slide member engages the inside surface of the end wall 210 of the cover which acts as a stop when the slide member retracts its full extent in the channel portion of the cover. The spring member 222 comprises a coil spring, although other means of applying axial spring force to the end of the slide member can be used. One end of the spring abuts a positioner 231 positioned within the channel 220 adjacent an intermediate section, and the rib wall 216 on an opposite end of the spring.

Figure 22:
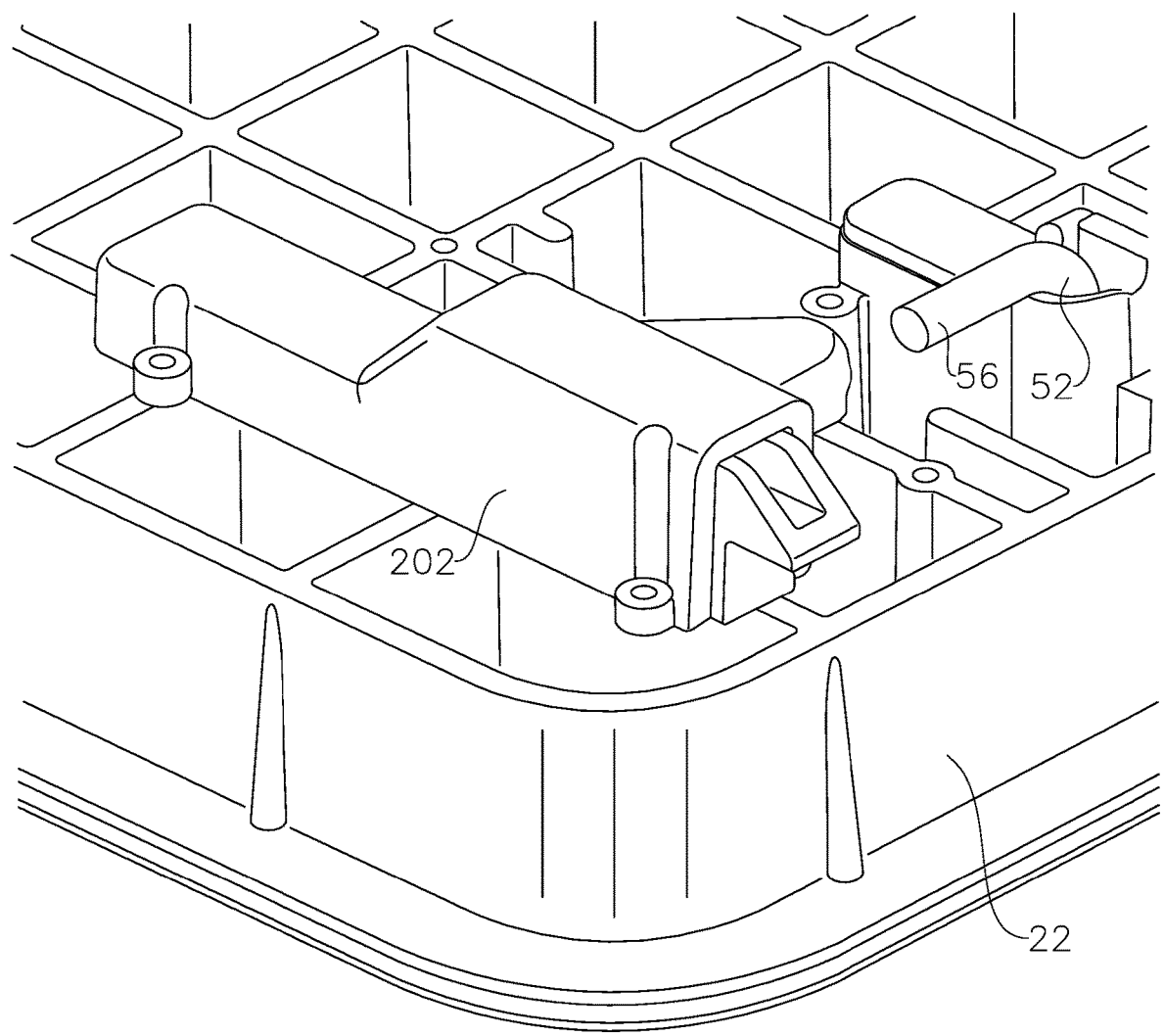
FIG. 22 is installation detail perspective view of the embodiment of FIG. 20.
Figure 23:
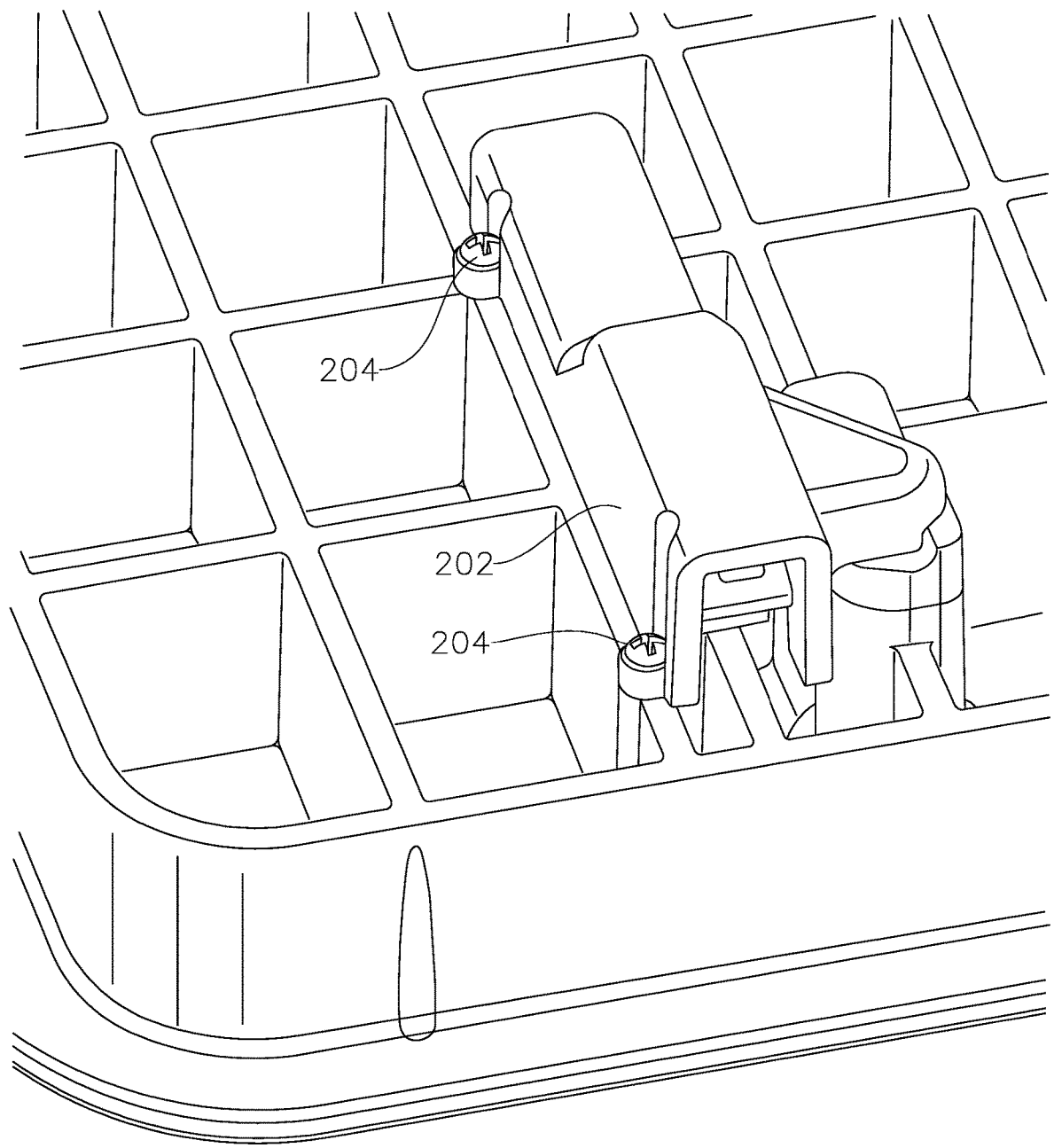
FIG. 23 is an installed detail perspective of of FIG. 22 illustrating the latch in a retracted position.

(3) The intermediate section includes a connection to the L-bolt 52 shown in FIG. 22 that rotates in unison with axial travel of the slide member 214. In the illustrated embodiment, the slide member's L-bolt connection comprises an opening 232 formed in the slide member so as to face laterally outwardly for contact with a right-angle leg 56 of the L-bolt. The opening 232 is positioned adjacent an angular face 234 formed on the intermediate section of the slide member between the spring-containing channel 220 on the rear section and the latch 218 on the front section of the slide member. The right-angle leg 56 of the L-bolt fits loosely within the opening 232. In use, rotation of the L-bolt can rotate the right-angle leg against the angular face 234 to push the slide member toward a retracted position against the bias of the spring member 222. When the spring tension is released, the slide member slides forward to the locking position. The right-angle leg of the L-bolt rotates in unison with the slide member's forward motion.

The cover 202 has a profile that separates and covers the attachment fasteners 204, spring member 222 and the actuating L-bolt 52 from the interior of the utility vault 80 and any equipment contained therein thus separating any possible contact or current path to the outside from inside the vault. The cover 202 shields contact from any conductive components of the locking assembly and further shields the mechanisms from incidental contact during use, and during installation or removal of the cover plate or lid from the vault.

The base 204 of the cover 202 is shaped to fit over the enclose the slide member 214. The cover includes fastener portions for receipt of the fasteners 204. The cover also includes a flange portion 236 to allow operation of the right-angle leg 56 of the L-bolt 52. The flange portion 236 has an opening 240 so, as shown in FIG. 22, the assembly 200 can be slid over the leg 56 of the bolt 52 during attachment of the assembly 200 to the underside of the lid. End 238 of cover 202 is open so that latch 218 can operate during installation and removal of the lid. Operation of assembly 200 is similar as described for the embodiment illustrated in FIGS. 1 through 4.

Although the present invention has been described and illustrated with respect to several embodiments thereof, it is to be understood that changes and modifications can be made therein which are within the full intended scope of the invention as hereinafter claimed.

What is claimed is:

1. A shielded locking system for securely closing a lid on an enclosure, comprising:
   a spring-biased slide member positioned within a non-conductive cover rigidly attached to an underside of the lid by fasteners;
   an L-bolt having a leg portion thereof coupled to the slide member;
   the L-bolt having an elongated shaft portion thereof rotatable in a slotted housing that securely retains the L-bolt under the lid;
   the slide member having a latch portion thereof adapted to engage a rim or another abutment on an inside of the enclosure when the lid is forced down over an opening in the enclosure, such a downward force on the lid progressively causing the latch to retract against a spring bias, from contact with the rim or abutment, and then snap the latch into a spring-biased locking position under the rim or abutment;
   the shaft portion of the L-bolt is accessible from the exterior of the lid for rotating the L-bolt to retract the latch against the spring-bias and from its locking position sufficiently for removing the lid from the enclosure,
   the non-conductive cover having a channel for receipt of and guiding travel of the spring-biased slide member within the non-conductive cover, the channel being formed by an end wall, a first side wall, a second side wall and a base wall of the non-conductive cover, the end wall located at an end of the first side wall, the second side wall and the base wall,
   wherein the non-conductive cover further includes a rigid rib wall extending inwardly into the channel from the end wall and the base wall and in between and spaced from the first side wall and the second side wall for engaging an end of a spring in the slide member at a distance away from the end wall, and
   wherein the non-conductive cover shields the L-bolt, spring and fasteners from electrical conductivity from within the enclosure.

2. The shielded locking system of claim 1, wherein the non-conductive cover has a flange portion for positioning over the leg portion of the L-bolt.

3. The shielded locking system of claim 1, wherein the non-conductive cover further includes fastener portions for shielding the fasteners for attaching the non-conductive cover to the lid.

4. The shielded locking system of claim 1, wherein the non-conductive cover has an open end for passage of the latch to engage the rim or other abutment on the inside of the enclosure.

5. A shielded self-latching locking system for securely closing a lid on an enclosure, comprising:
   a non-conductive cover secured to an underside of the lid by fasteners;
   a slide member disposed within the non-conductive cover, the slide member having a latch portion thereof positioned to engage an abutment located on an inside of the enclosure when the lid is forced down over an opening in the enclosure;
   a resilient spring member disposed in the slide member;
   the spring member normally biasing the latch to an extended position adapted for contact with the abutment on the enclosure, the slide member adapted to slide within the non-conductive cover, against the bias of the spring member, to said retracted position from the latch contacting the abutment with a downward force, when the lid is forced down over the opening in the enclosure, the slide member adapted to slide within a channel within the non-conductive cover to said retracted position due to the latch contacting the abutment when the lid is forced down over the opening of the enclosure due to the downward force applied to the top of the lid;
   the latch in said extended position being retained in a locking position beneath the abutment via the bias of the spring member;
   an L-bolt having a shaft portion thereof positioned in the lid adjacent the slide member and a leg portion thereof coupled to the slide member between the spring member and the latch,
   the non-conductive cover guiding spring-biased axial travel of the slide member within the non-conductive cover between the extended and retracted positions, in unison with rotation of the shaft portion of the L-bolt, the shaft portion of the L-bolt accessible from the exterior of the lid for rotating the L-bolt to retract the latch from the locking position and against the spring-bias sufficiently for removing the lid from the enclosure, the non-conductive cover shielding the spring member, L-bolt and fasteners from electrical conductivity from within the enclosure; and wherein the non-conductive cover includes an end wall, a first side wall, a second side wall and a base wall forming the channel, and a rigid rib wall extending inwardly into the channel from the end wall and the base wall in between and spaced from the first side wall and the second side wall for engaging an end of the spring member in the slide member at a distance away from the end wall, wherein the end wall is located at an end of the first side wall, the second side wall and the base wall.

6. The shielded self-latching locking system of claim 5, wherein the non-conductive cover has a flange portion for positioning over the leg portion of the L-bolt.

7. The shielded self-latching locking system of claim 5, wherein the non-conductive cover has fastener portions for shielding the fasteners, wherein the fasteners are used for attaching the non-conductive cover to the lid.

8. The shielded self-latching locking system of claim 5, wherein the non-conductive cover has an open end for passage of the latch to engage the abutment on the inside of the enclosure.

9. The shielded self-latching locking system of claim 5, wherein the slide member has a channel of the slide member for receipt of the spring member.

10. An equipment enclosure assembly, including:
a hollow enclosure, a lid for removably closing a top of the enclosure, and a shielded locking assembly for securely locking the lid to an opening in the enclosure, in which the enclosure has a locking surface positioned adjacent a rim or abutment on an inside wall of the enclosure, the shielded locking assembly positioned adjacent an edge of the lid for cooperating with the locking surface inside the enclosure, the shielded locking assembly comprising:
a self-latching slide member slidably disposed in a non-conductive shielding cover secured to an underside of the lid by fasteners;
a resilient biasing spring member engaging the slide member for controlling the spring-biased travel of the slide member toward and away from the locking surface;
a latch carried on the slide member and adapted to contact the rim or abutment on the enclosure from a downward force applied to the lid being positioned in the opening of the enclosure, the latch retracting the slide member against the spring-bias as the latch travels over the rim or abutment in response to the downward contact force applied to the rim or abutment, followed by snap-locking the latch into spring-biased engagement with the locking surface below the rim or abutment for locking the lid to the opening in the enclosure;

an L-bolt rotatably disposed in the lid, the L-bolt rotatable between an unlocked position and a locked position;

a slotted structure affixed to said underside of the lid, the slotted structure projecting downwardly away from the underside of the lid to a downwardly facing opening on the slotted structure which is spaced below the lid and positioned adjacent the locking surface and adjacent a guide frame, the L-bolt extending through a passage in the lid and in the slotted structure to the underside of the lid;

the L-bolt having (1) a right angle leg protruding below the bottom of the slotted structure; and (2) a position-adjusting device exposed to an upper surface of the lid;

a separate locking piece inserted into the passage in the slotted structure and positioned around the L-bolt to prevent removal of the L-bolt from the exterior of the lid once the L-bolt is positioned in the passage through the slotted structure;

the right angle leg of the L-bolt coupled to the slide member so that sliding travel of the slide member causes rotation of the L-bolt;

the non-conductive shielding cover guiding spring-biased axial travel of the slide member in unison with rotation of the L-bolt in the slotted structure, the snap-locking action of the latch engaging the locking surface in the enclosure causing the L-bolt to rotate to a spring-biased locked position, rotation of the L-bolt in a direction away from the locked position retracts the slide member against the spring-bias to allow removal of the lid from the enclosure; and wherein the non-conductive cover includes an end wall, a first side wall, a second side wall and a base wall forming the channel, and a rigid rib wall extending inwardly into the channel from the end wall and the base wall in between and spaced from the first side wall and the second side wall for engaging an end of the spring member in the slide member at a distance away from the end wall, wherein the end wall is located at an end of the first side wall, the second side wall and the base wall.

11. The equipment enclosure assembly of claim 10, wherein the non-conductive shielding cover has a flange portion for positioning over the leg portion of the L-bolt.

12. The equipment enclosure assembly of claim 10, wherein the non-conductive shielding cover further shields fasteners for attaching the non-conductive shielding cover to the lid.

13. The equipment enclosure assembly of claim 10, wherein the non-conductive shielding cover has an open end for passage of the latch to engage the abutment on the inside of the enclosure.

14. The equipment enclosure assembly of claim 10, wherein the slide member has a channel for receipt of the spring member.

15. The equipment enclosure assembly of claim 10, in which the enclosure is a utility vault.

16. The equipment enclosure assembly of claim 15, in which the utility vault contains underground communications equipment.

* * * * *